US008192914B2

(12) United States Patent
Irie

(10) Patent No.: US 8,192,914 B2
(45) Date of Patent: *Jun. 5, 2012

(54) RESIST COMPOSITION FOR IMMERSION EXPOSURE AND METHOD OF FORMING RESIST PATTERN

(75) Inventor: Makiko Irie, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/094,399

(22) PCT Filed: Dec. 8, 2006

(86) PCT No.: PCT/JP2006/324573
§ 371 (c)(1),
(2), (4) Date: May 20, 2008

(87) PCT Pub. No.: WO2007/069548
PCT Pub. Date: Jun. 21, 2007

(65) Prior Publication Data
US 2009/0053650 A1 Feb. 26, 2009

(30) Foreign Application Priority Data

Dec. 12, 2005 (JP) ................................. 2005-357493
Jan. 13, 2006 (JP) ................................. 2006-006013

(51) Int. Cl.
G03F 7/039 (2006.01)
G03F 7/20 (2006.01)
G03F 7/30 (2006.01)
(52) U.S. Cl. ..................... 430/270.1; 430/326; 430/910; 430/907; 430/914
(58) Field of Classification Search .......................... None
See application file for complete search history.

(56) References Cited

U.S. PATENT DOCUMENTS

| 5,908,730 | A | 6/1999 | Nitta et al. |
| 5,945,517 | A | 8/1999 | Nitta et al. |
| 6,180,313 | B1 | 1/2001 | Yukawa et al. |
| 6,329,125 | B2 | 12/2001 | Takechi et al. |
| 7,125,643 | B2 | 10/2006 | Harada et al. |
| 7,592,122 | B2 | 9/2009 | Ogata et al. |
| 7,608,381 | B2 | 10/2009 | Kinoshita et al. |
| 2005/0019690 | A1 | 1/2005 | Kodama |
| 2005/0227173 | A1 | 10/2005 | Hatakeyama et al. |
| 2005/0282985 | A1 | 12/2005 | Koyama et al. |
| 2006/0008736 | A1* | 1/2006 | Kanda et al. ............... 430/270.1 |
| 2006/0058480 | A1 | 3/2006 | Koyama et al. |
| 2006/0141400 | A1 | 6/2006 | Hirayama et al. |
| 2006/0246373 | A1 | 11/2006 | Wang |
| 2007/0099113 | A1* | 5/2007 | Kobayashi et al. ........ 430/270.1 |
| 2007/0134588 | A1 | 6/2007 | Kanda et al. |
| 2007/0134593 | A1 | 6/2007 | Hirayama et al. |
| 2007/0148589 | A1 | 6/2007 | Kanda et al. |
| 2007/0178405 | A1 | 8/2007 | Kanda et al. |
| 2007/0190448 | A1* | 8/2007 | Ishiduka et al. ........... 430/270.1 |
| 2008/0003517 | A1* | 1/2008 | Komoriya et al. ............ 430/130 |
| 2008/0193871 | A1 | 8/2008 | Ogata et al. |
| 2009/0123869 | A1 | 5/2009 | Wang |

FOREIGN PATENT DOCUMENTS

| JP | 09-208554 | 8/1997 |
| JP | H09-208554 | 8/1997 |
| JP | H10-161313 | 6/1998 |
| JP | 11-35551 | 2/1999 |
| JP | 11-35552 | 2/1999 |
| JP | 11-35573 | 2/1999 |
| JP | H11-035551 | 2/1999 |
| JP | H11-035552 | 2/1999 |
| JP | H11-035573 | 2/1999 |
| JP | 11-322707 | 11/1999 |
| JP | H11-322707 | 11/1999 |
| JP | A-2004-256562 | 9/2004 |
| JP | A-2004-348106 | 12/2004 |
| JP | 2005-55890 | 3/2005 |
| JP | A-2005-146252 | 6/2005 |
| JP | A-2005-220059 | 8/2005 |
| JP | A-2005-250511 | 9/2005 |
| JP | 2005-316259 A * | 11/2005 |
| JP | 2005-320516 | 11/2005 |
| JP | 2006-48029 | 2/2006 |
| JP | A-2006-028472 | 2/2006 |
| JP | 2006-178317 | 7/2006 |
| JP | A-2007-145804 | 6/2007 |
| KR | 10-2006-0114293 A | 11/2006 |

(Continued)

OTHER PUBLICATIONS

Machine-assisted English translation of JP2005-316259 provided by JPO (Nov. 2005).*
International Search Report in connection with corresponding PCT application No. PCT/JP2006/324573, dated Dec. 8, 2006.
Hoffangle et al., *Liquid Immersion deep-ultraviolet interferometric lithography*, Journal of Vacuum Science & Technology B, vol. 17 No. 6, pp. 3306-3309 (1999).
Switkes et al., *Immersion Lithography at 157 nm*, Journal of Vacuum Science & Technology B, vol. 19 No. 6, pp. 2353-2356 (2001).
Switkes et al., *Resolution Enhancement of 157 nm Lithography by Liquid Immersion*, Proceedings of SPIE, vol. 4691, pp. 459-465 (2002).

(Continued)

Primary Examiner — Sin J. Lee
(74) Attorney, Agent, or Firm — Knobbe Martens Olson & Bear LLP

(57) ABSTRACT

A resist composition for immersion exposure and a method of forming a resist pattern are provided which can satisfy both of excellent resistance to an immersion medium and lithography properties. The resist composition for immersion exposure includes a resin component (A) which exhibits changed alkali solubility under action of acid and an acid-generator component (B) which generates acid upon irradiation, the resin component (A) including a resin (A1) which contains a fluorine atom and a resin (A2) which has a structural unit (a') derived from acrylic acid and contains no fluorine atom, and the amount of the resin (A1) contained in the resin component (A) being within the range from 0.1 to 50% by weight.

4 Claims, 1 Drawing Sheet

FOREIGN PATENT DOCUMENTS

| | | | |
|---|---|---|---|
| KR | 10-2007-0014086 | A | 1/2007 |
| KR | 10-2007-0046745 | | 5/2007 |
| KR | 10-2007-0061368 | A | 6/2007 |
| KR | 10-2007-0061432 | A | 6/2007 |
| WO | WO 2004/074242 | A2 | 9/2004 |
| WO | WO 2005/080306 | A1 * | 9/2005 |
| WO | WO 2005/085954 | A1 * | 9/2005 |
| WO | WO 2006/040949 | A1 | 4/2006 |

OTHER PUBLICATIONS

Gil et al., *First Microprocessors with Immersion Lithography*, Proceedings of SPIE, vol. 5754, 119-128 (2005).

Kodama et al., *Synethsis of Novel Fluoropolymer for 157nm Photoresists by Cyclo-polymerization*, Proceedings of SPIE, vol. 4690, 76-83 (2002).

Office Action (Trial for Patent Invalidation) issued in corresponding Korean Patent Application No. 10-0965445, dated Jan. 21, 2011.

Office Action (Notice of Allowance) issued in corresponding Japanese Patent Application No. JP 2006-006013, mailed Mar. 22, 2011.

Office Action (Notice of Allowance) issued in corresponding Japanese Patent Application No. JP 2006-280201, mailed May 24, 2011.

Invalidity Opinion in Korean Patent Application No. 10-0965445 dated Aug. 24, 2011.

Invalidity Opinion in Korean Patent Application No. 10-2008-7014773 dated Aug. 24, 2011.

Office Action issued in corresponding Japanese Patent Application No. 2006-006013, dated Jan. 25, 2011.

Office Action (argument submitted by the demandant) in corresponding Korean Patent Application No. 10-2008-7014773 (Patent No. 10-0965445), mailed Nov. 28, 2011.

* cited by examiner

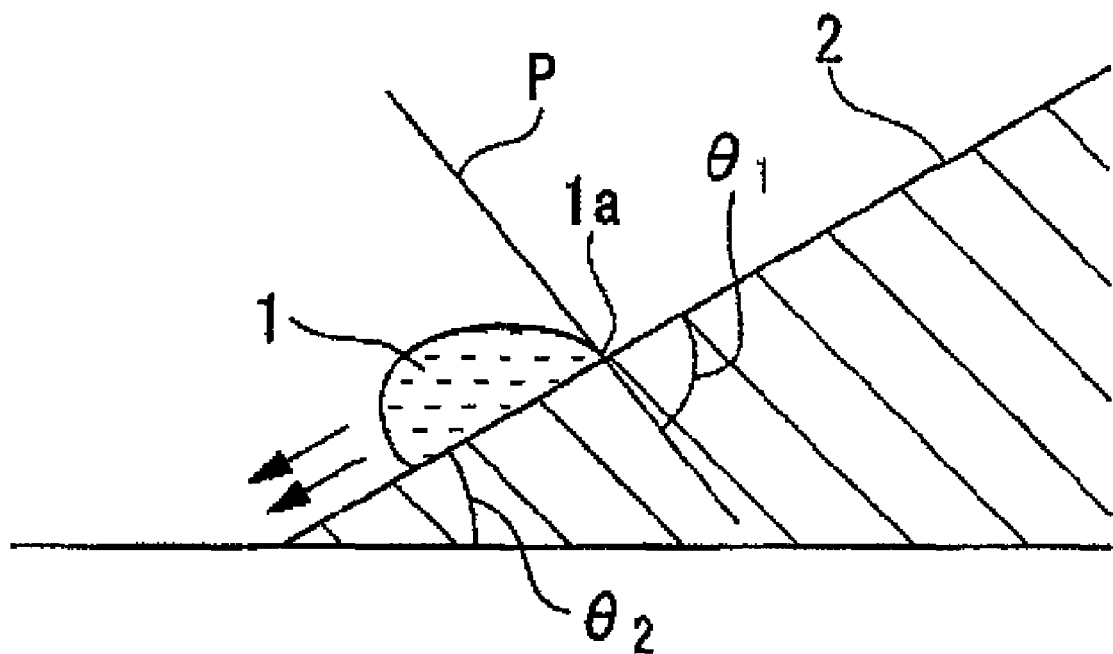

RESIST COMPOSITION FOR IMMERSION EXPOSURE AND METHOD OF FORMING RESIST PATTERN

RELATED APPLICATIONS

This application is the U.S. National Phase filing under 35 U.S.C. §371 of PCT/JP2006/324573, filed Dec. 8, 2006, which designated the United States and was published in a language other than English, which claims priority under 35 U.S.C. §119(a)-(d) to Japanese Patent Application No. 2005-357493, filed Dec. 12, 2005, and Japanese Patent Application No. 2006-006013, filed Jan. 13, 2006. The contents of these applications are incorporated herein by reference in their entireties.

TECHNICAL FIELD

The present invention relates to a resist composition for use in immersion exposure (immersion exposure), and a method of forming a resist pattern.

BACKGROUND ART

Lithography methods are widely used in the production of microscopic structures in a variety of electronic devices such as semiconductor devices and liquid crystal devices, and ongoing miniaturization of the structures of these devices has lead to demands for further miniaturization of the resist patterns used in these lithography processes. With current lithography methods, using the most up-to-date ArF excimer lasers, fine resist patterns with a line width of approximately 90 nm are able to be formed, but in the future, even finer pattern formation will be required.

In order to enable the formation of these types of ultra fine patterns of less than 90 nm, the development of appropriate exposure apparatus and corresponding resists is the first requirement.

With respect to resists, chemically amplified resists, which enable high levels of resolution to be achieved, are able to utilize a catalytic reaction or chain reaction of an acid generated by irradiation, exhibit a quantum yield of 1 or greater, and are capable of achieving high sensitivity, are attracting considerable attention, and development of these resists is flourishing.

In positive chemically amplified resists, resins having acid dissociable, dissolution inhibiting groups are the most commonly used. Examples of known acid dissociable, dissolution inhibiting groups include acetal groups such as ethoxyethyl groups, tertiary alkyl groups such as tert-butyl groups, as well as tert-butoxycarbonyl groups and tert-butoxycarbonylmethyl groups. Furthermore, structural units derived from tertiary ester compounds of (meth)acrylic acid, such as 2-alkyl-2-adamantyl (meth)acrylates, are widely used as the structural units containing an acid dissociable, dissolution inhibiting group within the resin component of conventional ArF resist compositions, as disclosed in Patent Document 1 listed below.

On the other hand, with respect to the exposure apparatus, techniques such as shortening the wavelength of the light source used, and increasing the diameter of the lens aperture (NA) (namely, increasing NA) are common. For example, for a resist resolution of approximately 0.5 µm, a mercury lamp for which the main spectrum is the 436 nm g-line is used, for a resolution of approximately 0.5 to 0.30 µm, a similar mercury lamp for which the main spectrum is the 365 nm i-line is used, for a resolution of approximately 0.3 to 0.15 µm, 248 nm KrF excimer laser light is used, and for resolutions of approximately 0.15 µm or less, 193 nm ArF excimer laser light is used. In order to achieve even greater miniaturization, the use of $F_2$ excimer laser (157 nm), $Ar_2$ excimer laser (126 nm), extreme ultraviolet radiation (EUV: 13 nm), electron beam (EB), and X-ray and the like is also being studied.

However, shortening the wavelength of the light source requires a new and expensive exposure apparatus. Furthermore, if the NA value is increased, since the resolution and the depth of focus exist in a trade-off type relationship, even if the resolution is increased, a problem arises in that the depth of focus is lowered.

Against this background, a method known as immersion exposure (immersion lithography) has been reported (for example, see Non-Patent Documents 1 to 3). In this method, exposure (immersion exposure) is conducted in a state where the region between the lens and the resist layer formed on a wafer, which has conventionally been filled with air or an inert gas such as nitrogen, is filled with a solvent (a immersion medium) that has a larger refractive index than the refractive index of air.

According to this type of immersion exposure, it is claimed that higher resolutions equivalent to those obtained using a shorter wavelength light source or a larger NA lens can be obtained using the same exposure light source wavelength, with no lowering of the depth of focus. Furthermore, immersion exposure can be conducted using existing exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution. Currently, water is mainly used as the immersion medium for immersion lithography.

[Patent Document 1]
Japanese Unexamined Patent Application, First Publication No. Hei 10-161313

[Non-Patent Document 1] Journal of Vacuum Science & Technology B (U.S.), 1999, vol. 17, issue 6, pp. 3306 to 3309.

[Non-Patent Document 2] Journal of Vacuum Science & Technology B (U.S.), 2001, vol. 19, issue 6, pp. 2353 to 2356.

[Non-Patent Document 3] Proceedings of SPIE (U.S.), 2002, vol. 4691, pp. 459 to 465.

DISCLOSURE OF INVENTION

Means to Solve the Problems

However, many factors associated with immersion exposure remain unknown, and the formation of an ultra fine resist pattern of a level suitable for actual use remains problematic. For example, in immersion lithography, as described above, the immersion medium comes in contact with the resist film and the tens. As a result, lithography properties may be adversely affected by elution of a substance contained in the resist into the immersion medium, which cause degeneration of the resist film and lowering of the performance thereof, local change in the refractive index of the immersion medium caused by the eluted substance, and staining of the lens surface by the eluted substance. Therefore, problems are likely to occur including deterioration in the sensitivity, formation of T-top shaped resist patterns, roughening of the surface of the resist pattern, or swelling of the resist pattern.

As a technique for solving the above-described problems, improving the resistance of the resist film to the immersion medium can be considered. Currently, since aqueous solvent such as water is mainly considered as the immersion medium, it is presumed that enhancing the hydrophobicity of the resist film is effective in improving the resistance to the immersion medium.

However, changing the composition of the resist for enhancing the hydrophobicity of the resist film generally results in deterioration of the lithography properties. Therefore, achieving both of resistance to the immersion medium and lithography properties is difficult.

The present invention takes the above circumstances into consideration, with an object of providing a resist composition for immersion exposure and method of forming a resist pattern, which can achieve both of excellent resistance to an immersion medium and excellent lithography properties.

Means to Solve the Problems

As a result of studies of the present inventors, it has been found that the above-mentioned problems can be solved by using a combination of an acrylate resin and a fluorine atom-containing resin in a specific amount. The present invention has been completed based on this finding.

Accordingly, a first aspect of the present invention is a resist composition for immersion exposure including a resin component (A) which exhibits changed alkali solubility under action of acid and an acid-generator component (B) which generates acid upon irradiation, the resin component (A) including a resin (A1) which contains a fluorine atom and a resin (A2) which has a structural unit (a') derived from acrylic acid and contains no fluorine atom, and the amount of the resin (A1) contained in the resin component (A) being within the range from 0.1 to 50% by weight.

A second aspect of the present invention is a method of forming a resist pattern, including: applying a resist composition for immersion exposure of the first aspect to a substrate to form a resist film on the substrate; subjecting the resist film to immersion exposure; and developing the resist film to form a resist pattern.

In the present invention, the term "structural unit" refers to a monomer unit that contributes to the formation of a polymer (resin).

An "alkyl group" includes a linear, branched or cyclic, monovalent saturated hydrocarbon, unless otherwise specified.

A "lower alkyl group" is an alkyl group of 1 to 5 carbon atoms.

The term "exposure" is used as a general concept that includes not only irradiation of light, but also irradiation with any form of radiation such as electron beam.

EFFECT OF THE INVENTION

According to the present invention, there are provided a resist composition for immersion exposure and method of forming a resist pattern, which can achieve both of excellent resistance to an immersion medium and excellent lithography properties.

BRIEF DESCRIPTION OF THE DRAWINGS

FIG. 1 is an explanatory diagram of receding angle and sliding angle.

BEST MODE FOR CARRYING OUT THE INVENTION

Hereinbelow, the present invention will be described in detail.

<<Resist Composition for Immersion Exposure>>

A resist composition for immersion exposure according to the present invention includes a resin component (A) (hereafter referred to as the component (A)) which exhibits changed alkali solubility under action of acid and an acid-generator component (B) (hereafter, frequently referred to as "component (B)") which generates acid upon exposure.

In the present invention, it is necessary that the resin component (A) include a resin (A1) which contains a fluorine atom and a resin (A2) which has a structural unit (a') derived from acrylic acid and contains no fluorine atom, and the amount of the resin (A1) contained in the component (A) be within the range from 0.1 to 50% by weight.

The resist composition for immersion exposure according to the present invention may be either a so-called negative composition, or a so-called positive composition. The resist composition of the present invention is preferably a positive resist composition.

When the resist composition for immersion exposure according to the present invention is a negative resist composition, the component (A) is an alkali-soluble resin, and a cross-linking agent (C) is blended with the resist composition.

With respect to the negative resist composition, during resist pattern formation, when acid is generated from the component (B) upon exposure, the action of this acid causes cross-linking between the alkali-soluble resin and the cross-linking agent, and the cross-linked portion becomes alkali insoluble.

As the alkali-soluble resin, it is preferable to use a resin having a structural unit derived from at least one of α-(hydroxyalkyl)acrylic acid and a lower alkyl ester of α-(hydroxyalkyl)acrylic acid, as it enables formation of a satisfactory resist pattern with minimal swelling. Here, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linking agent (C), typically, an amino-based cross-linking agent such as a glycoluril having a methylol group or alkoxymethyl group is preferable, as it enables formation of a resist pattern with minimal swelling. The amount of the cross-linking agent (C) added is preferably within the range from 1 to 50 parts by weight, relative to 100 parts by weight of the alkali-soluble resin.

When the resist composition for immersion exposure according to the present invention is a positive resist composition, as the component (A), a resin having acid dissociable, dissolution inhibiting groups and exhibiting increased alkali solubility under action of acid is used. With respect to the positive resist composition, during resist pattern formation, when acid is generated from the component (B) upon exposure, the acid dissociable, dissolution inhibiting groups are dissociated by the generated acid, and the component (A) becomes alkali soluble. Therefore, in the formation of a resist pattern, by conducting selective exposure of the resist composition applied onto a substrate, the alkali solubility of the exposed portions is enhanced, and hence, a resist pattern can be formed by alkali developing.

[Resin (A1)]

As the resin (A1), there is no particular limitation as long as it is a resin containing a fluorine atom, and one or more kinds of alkali-soluble resins or resins capable of becoming alkali-soluble, which have conventionally been proposed as a chemically amplified photoresist can be exemplified. When the former is used, the resist composition becomes a negative type, and when the latter is used, the composition becomes a positive type.

In either case of a positive type or a negative type, it is preferable that the resin (A1) have a fluorinated hydroxyalkyl group, as the effects of the present invention become superior.

The term "fluorinated hydroxyalkyl group" refers to a hydroxyalkyl group in which some of the hydrogen atoms are substituted with hydroxy groups, wherein some or all of the remainder of the hydrogen atoms within the alkyl group (hydrogen atoms within the alkyl group which have not been substituted with hydroxyl groups) are substituted with fluorine atoms. In a fluorinated hydroxyalkyl group, the hydrogen atom of the hydroxy group can be easily released due to the fluorination.

In the fluorinated hydroxyalkyl group, the alkyl group is preferably linear or branched. The number of carbon atoms of the alkyl group is not particularly limited, but is preferably from 1 to 20, more preferably 4 to 16, and most preferably 4 to 12. The number of hydroxy groups is not particularly limited, but is preferably 1.

Among these, as the fluorinated hydroxyalkyl group, groups in which a fluorinated alkyl group and/or a fluorine atom is bonded to the carbon atom having the hydroxy group bonded thereto (i.e., the carbon atom on the α-position within the hydroxyalkyl group) are preferable.

Especially, the fluoroalkyl group bonded to the α-position is preferably a perfluoroalkyl group in which all of the hydrogen atoms of the alkyl group have been substituted with fluorine atoms.

In the present invention, it is particularly desirable that the resin (A1) have a group represented by general formula (I) shown below.

[Chemical Formula 1]

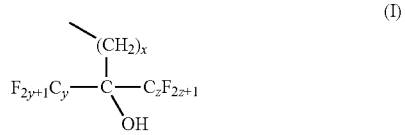

(I)

wherein x represents an integer of 0 to 5; and y and z each independently represents an integer of 1 to 5.

In general formula (I) above, x is preferably an integer of 0 to 3, and it is particularly desirable that x be 0 or 1.

It is preferable that y and z each independently represents an integer of 1 to 3, and most preferably 1.

In either case of a positive type or a negative type, the resin (A1) preferably has a structural unit (a) derived from acrylic acid.

In the present description and the claims, the concept of "acrylic acid" includes acrylic acid ($CH_2=CHCOOH$) in a narrow sense and derivatives thereof in which some or all of the hydrogen atoms are substituted with other groups or atoms.

Examples of acrylic acid derivatives include α-substituted acrylic acids which are acrylic acid in a narrow sense having a substituent (an atom or group other than a hydrogen atom) bonded to the carbon atom on the α-position, and acrylate esters of such α-substituted acrylic acids in which the hydrogen atom within the carboxy group is substituted with an organic group.

As the organic group within the acrylate ester, there is no particular limitation, and examples thereof include groups bonded to the side-chain portion of the acrylate ester (e.g., groups having a fluorinated alkyl group and an aliphatic monocyclic/polycyclic group, acid dissociable, dissolution inhibiting groups, lactone ring-containing groups, polar group-containing aliphatic hydrocarbon groups and aliphatic polycyclic hydrocarbon groups) within the structural units (a0) to (a4) described below.

The "α-position (the carbon atom on the α-position)" of acrylic acid refers to the carbon atom having the carbonyl group bonded thereto, unless specified otherwise.

Examples of the substituent within the α-substituted acrylic acid include a halogen atom, a lower alkyl group and a halogenated lower alkyl group.

Examples of halogen atoms for the substituent at the α-position include a fluorine atom, a chlorine atom, a bromine atom and an iodine atom, and a fluorine atom is particularly desirable.

Specific examples of the lower alkyl group for the substituent at the α-position include linear or branched lower alkyl groups such as a methyl group, ethyl group, propyl group, isopropyl group, n-butyl group, isobutyl group, tert-butyl group, pentyl group, isopentyl group, and neopentyl group.

The "lower alkyl group" within the halogenated alkyl group for the substituent at the α-position is the same as the lower alkyl groups described above. The halogen atom within the halogenated alkyl group is the same as the halogen atoms described above.

The substituent bonded to the α-position of acrylic acid is preferably a hydrogen atom, a halogen atom, a lower alkyl group or a halogenated lower alkyl group, and more preferably a hydrogen atom, a fluorine atom, a lower alkyl group or a fluorinated lower alkyl group. In terms of industrial availability, a hydrogen atom or a methyl group is particularly desirable.

The term "structural unit derived from acrylic acid" refers to a structural unit which is formed by the cleavage of the ethylenic double bond of acrylic acid.

The term "structural unit derived from an acrylate ester" refers to a structural unit which is formed by the cleavage of the ethylenic double bond of an acrylate ester.

As the structural unit (a), a structural unit represented by general formula (a) shown below can be exemplified.

[Chemical Formula 2]

(a)

wherein R represents a hydrogen atom, a halogen atom, a lower alkyl group or a halogenated lower alkyl group; and X represent a hydrogen atom or a monovalent organic group.

As the halogen atom, lower alkyl group and halogenated lower alkyl group for R, the same as the halogen atom, lower alkyl group and halogenated lower alkyl group for the above-mentioned substituent at the α-position can be exemplified.

As the organic group for X, the same as the "organic group within the acrylate ester" described above can be exemplified.

In the resin (A1), the amount of the structural unit (a) based on the combined total of all structural units constituting the resin (A1) is preferably from 50 to 100 mol %, and more preferably 70 to 100 mol %. It is particularly desirable that the resin (A1) consist of the structural unit (a) derived from acrylic acid, as it becomes particularly advantageous in terms of the effects of the present invention.

Here, the expression "consist of the structural unit (a)" means that the main chain of the resin (A1) is constituted from only the structural unit (a), and does not contain any other structural units.

In the present invention, it is preferable that the resin (A1) have a structural unit (a0) derived from an acrylic ester having on the side chain portion thereof a fluorinated hydroxyalkyl group and an aliphatic monocyclic/polycyclic group (aliphatic cyclic group).

In the present description and the claims, the term "side chain portion" refers to the portion which does not constitute the main chain. As the structural unit (a0), structural units in which X in general formula (a) above is a group having both of a fluorinated hydroxyalkyl group and an aliphatic monocyclic/polycyclic group can be exemplified.

With respect to the "aliphatic cyclic group", the term "aliphatic" is a relative concept used in relation to the term "aromatic", and defines a group or compound that has no aromaticity.

The aliphatic cyclic group may be monocyclic or polycyclic. The term "aliphatic monocyclic group" refers to a monocyclic group that has no aromaticity, and the term "aliphatic polycyclic group" refers to a polycyclic group that has no aromaticity.

The aliphatic cyclic group may be a hydrocarbon group (alicyclic group) consisting of carbon and hydrogen, or a heterocyclic group in which some of the carbon atoms constituting the ring of the alicyclic group are replaced by hetero atoms such as oxygen atoms, nitrogen atoms or sulfur atoms. The aliphatic cyclic group is preferably an alicyclic group.

The aliphatic cyclic group may be either saturated or unsaturated, but is preferably saturated, as it exhibits high transparency to ArF excimer lasers and the like, and is superior in resolution, depth of focus (DOF) and the like.

The number of carbon atoms of the aliphatic cyclic group is preferably from 5 to 15.

As aliphatic monocyclic groups, groups in which two or more hydrogen atoms (including the hydrogen atom substituted with the fluorinated alkyl group; the same applies below) have been removed from a monocycloalkane can be exemplified. Specific examples of such aliphatic monocyclic groups include groups in which two or more hydrogen atom has been removed from cyclopentane or cyclohexane, and groups in which two or more hydrogen atom has been removed from cyclohexane is preferable.

As aliphatic polycyclic groups, groups in which two or more hydrogen atom has been removed from a bicycloalkane, tricycloalkane or tetracycloalkane can be exemplified. Specific examples of such aliphatic polycyclic groups include groups in which two or more hydrogen atom has been removed from a polycycloalkane such as adamantane, norbornane, isobornane, tricyclodecane or tetracyclododecane.

As the polycyclic group, any of the multitude of conventional polycyclic groups constituting acid dissociable, dissolution inhibiting groups within a resin for resist compositions used in an ArF excimer laser process can be appropriately selected.

In terms of industrial availability, cyclohexane is preferable as the monocyclic group, and a group in which two or more hydrogen atom has been removed from adamantane, norbornane or tetracyclododecane is preferable as the polycyclic group, and a group in which two or more hydrogen atom has been removed from norbornane is particularly desirable.

In the present invention, it is particularly desirable that the structural unit (a0) includes at least one member selected from the group consisting of structural units represented by general formulas (a0-1) to (a0-3) shown below.

[Chemical Formula 3]

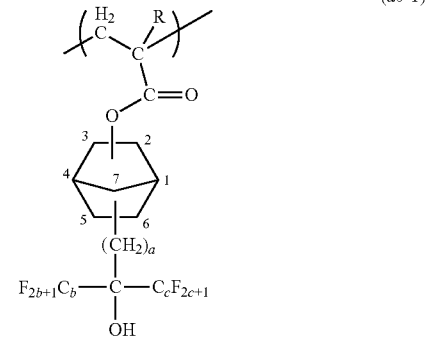

(a0-1)

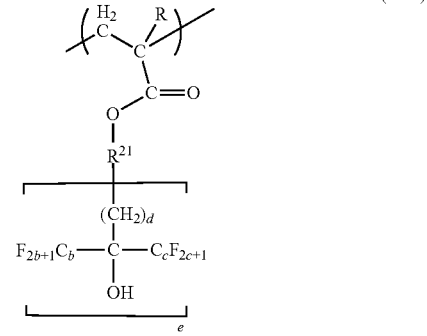

(a0-2)

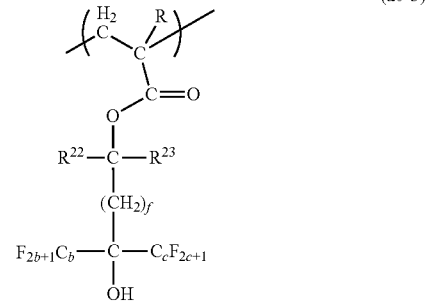

(a0-3)

wherein R represents a hydrogen atom, an alkyl group, a halogen atom or a halogenated alkyl group; $R^{21}$ represents an aliphatic cyclic group having a valency of (e+1); $R^{22}$ and $R^{23}$ each independently represents a hydrogen atom or a monovalent aliphatic cyclic group, with the proviso that at least one of $R^{22}$ and $R^{23}$ represents an aliphatic cyclic group; a, d and f each independently represents an integer of 0 to 5; b and c each independently represents an integer of 1 to 5; and e represents 2 or 3.

The structural unit represented by general formula (a0-1) hereafter, referred to as "structural unit (a0-1)") is a structural unit which contains a norbornyl group having one specific fluorinated hydroxyalkyl group [—$(CH_2)_a$—$C(C_bF_{2b+1})$ $(C_cF_{2c+1})$—OH]. By including the structural unit (a0-1), the effects of the present invention are further improved.

In general formula (a0-1), as R, the same as those exemplified above for R in formula (a) can be mentioned.

In general formula (a0-1), R is preferably a hydrogen atom or an alkyl group, more preferably a hydrogen atom or a methyl group, and most preferably a hydrogen atom.

a is an integer of 1 to 5, preferably an integer of 1 to 3, and most preferably 1.

b and c each independently represents an integer of 1 to 5, preferably 1 to 3, and most preferably 1.

The structural unit (a0-1) preferably has a 2-norbornyl group in which —$(CH_2)_a$—$C(C_bF_{2b+1})(C_cF_{2c+1})$—OH is bonded to the 5th or 6th position of the norbornyl group. In terms of effects of the present invention, ease in synthesis and achieving high etching resistance, it is particularly desirable that R be a hydrogen atom or a methyl group, and all of a, b, and c be 1.

The structural unit represented by general formula (a0-2) (hereafter, referred to as "structural unit (a0-2)") is a structural unit which contains an aliphatic cyclic group having two or three —$(CH_2)_d$—$C(C_bF_{2b+1})(C_cF_{2c+1})$—OH. By including the structural unit (a0-2), the solubility in an alkali developing solution is enhanced, and the effects of the present invention are further improved.

In general formula (a0-2), R is the same as R in general formula (a0-1). In general formula (a0-2), R is preferably a hydrogen atom or an alkyl group, more preferably a hydrogen atom or a methyl group, and most preferably a methyl group.

b and c are the same as b and c in formula (a0-1) above.

d is an integer of 0 to 5, preferably 0 or 1, and most preferably 0.

e is 2 or 3, and most preferably 2.

$R^{21}$ represents an aliphatic cyclic group having a valency of (e+1). The term "aliphatic cyclic group having a valency of (e+1)" refers to an aliphatic cyclic group in which (e+1) hydrogen atoms bonded to the carbon atoms constituting the ring skeleton of the aliphatic cyclic group have been removed.

As the aliphatic cyclic group for $R^{21}$, the same as those exemplified above for the "aliphatic cyclic groups" can be mentioned. The aliphatic cyclic group for $R^{21}$ may be monocyclic or polycyclic, although a monocyclic group is particularly desirable as it becomes superior in the effects of the present invention.

$R^{21}$ preferably has 3 to 20 carbon atoms, and more preferably 4 to 15 carbon atoms. Specific examples include groups in which (e+1) hydrogen atoms have been removed from cyclopentane, cyclohexane, adamantane, norbornane, isobornane, tricyclodecane and tetracyclododecane. In the present invention, it is particularly desirable that $R^{21}$ be a group in which (e+1) hydrogen atoms have been removed from cyclohexane.

The structural unit represented by general formula (a0-3) (hereafter, referred to as "structural unit (a0-3)") is a structural unit having a methyl group in which the hydrogen atoms have been substituted with one —$(CH_2)_f$—$C(C_bF_{2b+1})$ $(C_cF_{2c+1})$—OH and one or two aliphatic cyclic groups. By including the structural unit (a0-3), the effects of the present invention are further improved.

In general formula (a0-3), R is the same as R in general formula (a0-1). In general formula (a0-3), R is preferably a hydrogen atom or an alkyl group, more preferably a hydrogen atom or a methyl group, and most preferably a methyl group.

b and c are the same as b and c in formula (a0-1) above.

f is preferably an integer of 1 to 5, more preferably 1 to 3, and most preferably 1.

$R^{22}$ and $R^{23}$ each independently represents a hydrogen atom or a monovalent aliphatic cyclic group, with the proviso that at least one of $R^{22}$ and $R^{23}$ represents an aliphatic cyclic group. As the aliphatic cyclic group for $R^{22}$ and $R^{23}$, the same as those exemplified above for the "aliphatic cyclic groups" can be mentioned. The aliphatic cyclic group for $R^{21}$ may be monocyclic or polycyclic, although a polycyclic group is particularly desirable as it becomes superior in the effects of the present invention.

$R^{22}$ and $R^{23}$ preferably have 5 to 15 carbon atoms, and more preferably 6 to 12 carbon atoms. Specifically, groups in which one or more hydrogen atoms have been removed from adamantane, norbornane, tricyclodecane, tetracyclododecane are preferable, and groups in which one or more hydrogen atoms have been removed from norbornane are particularly desirable.

In the present invention, it is particularly desirable that either one of $R^{22}$ and $R^{23}$ be a hydrogen atom, and the other be an aliphatic cyclic group.

As the structural unit (a0), one type of structural unit may be used, or two or more types may be used in combination.

In the resin (A1), the amount of the structural unit (a0) based on the combined total of all structural units constituting the resin (A1) is preferably 5 to 80 mol %, more preferably 5 to 70 mol %, and most preferably 10 to 60 mol %. By making the amount of the structural unit (a0) at least as large as the lower limit of the above-mentioned range, the effects of including the structural unit (a0) can be satisfactorily achieved. On the other hand, by making the amount of the structural unit (a0) no more than the upper limit of the above-mentioned range, a good balance can be achieved with the other structural units.

Structural Unit (a1)

When the resist composition for immersion exposure according to the present invention is a positive resist composition, it is preferable that the resin (A1) have a structural unit (a1) derived from an acrylate ester having an acid dissociable, dissolution inhibiting group.

As the acid dissociable, dissolution inhibiting group within the structural unit (a1), any of the groups that have been proposed as acid dissociable, dissolution inhibiting groups for the base resins of chemically amplified resists can be used, provided the group has an alkali dissolution-inhibiting effect that renders the entire resin (A1) alkali-insoluble prior to exposure, and then following dissociation, causes the entire resin (A1) to change to an alkali-soluble state. Generally, groups that form either a cyclic or linear tertiary alkyl ester, or a cyclic or linear alkoxyalkyl ester with the carboxyl group of the (meth)acrylate ester are the most widely known. In the present description, the term "(meth)acrylate ester" is a generic term that includes either or both of the acrylate ester having a hydrogen atom bonded to the α-position and the methacrylate ester having a methyl group bonded to the α-position.

Here, a tertiary alkyl ester describes a structure in which an ester is formed by substituting the hydrogen atom of the carboxyl group with a linear or cyclic tertiary alkyl group, and the tertiary carbon atom within the linear or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The linear or cyclic alkyl group may have a substituent. The linear or cyclic alkyl group preferably has 4 to 15 carbon atoms, and more preferably 4 to 12 carbon atoms.

Hereafter, for the sake of simplicity, groups that exhibit acid dissociability as a result of the formation of a tertiary alkyl ester with the carboxyl group are referred to as "tertiary alkyl ester-type acid dissociable, dissolution inhibiting groups".

Furthermore, a cyclic or linear alkoxyalkyl ester describes a structure in which an ester is formed by substituting the hydrogen atom of the carboxyl group with an alkoxyalkyl group, and the alkoxyalkyl group is bonded to the oxygen atom at the terminal of the carbonyloxy group (—C(O)—O—). In this alkoxyalkyl ester, the action of acid causes cleavage of the bond between the oxygen atom and the alkoxyalkyl group. The alkoxyalkyl group preferably has 4 to 15 carbon atoms, more preferably 4 to 12 carbon atoms.

As the structural unit (a1), it is preferable to use at least one structural unit selected from the group consisting of structural units represented by a general formula (a1-0-1) shown below and structural units represented by a general formula (a1-0-2) shown below.

[Chemical Formula 4]

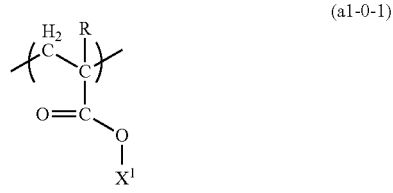

(a1-0-1)

wherein, R represents a hydrogen atom, halogen atom, lower alkyl group, or halogenated lower alkyl group; and $X^1$ represents an acid dissociable, dissolution inhibiting group.

[Chemical Formula 5]

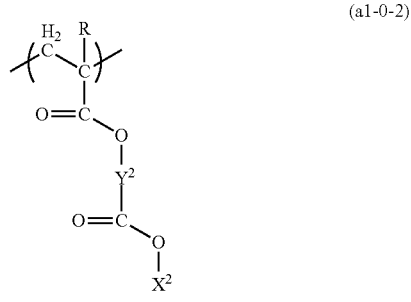

(a1-0-2)

wherein, R represents a hydrogen atom, halogen atom, lower alkyl group, or halogenated lower alkyl group; $X^2$ represents an acid dissociable, dissolution inhibiting group; and $Y^2$ represents an alkylene group or an aliphatic cyclic group.

In general formula (a1-0-1) shown above, the halogen atom, lower alkyl group and halogenated lower alkyl group for R are the same as the halogen atom, lower alkyl group or halogenated lower alkyl group which can be bonded to the α-position of the aforementioned acrylate ester.

There are no particular limitations on the group $X^1$, provided it functions as an acid dissociable, dissolution inhibiting group, and suitable examples include an alkoxyalkyl group or a tertiary alkyl ester-type acid-dissociable, dissolution-inhibiting group, although a tertiary alkyl ester-type acid dissociable, dissolution inhibiting group is preferable. Examples of suitable tertiary alkyl ester-type acid dissociable, dissolution inhibiting groups include aliphatic branched acid dissociable, dissolution inhibiting groups and acid dissociable, dissolution inhibiting groups that contain an aliphatic cyclic group.

The "aliphatic cyclic group" within the structural unit (a1) may or may not have a substituent.

Examples of suitable substituent groups include lower alkyl groups of 1 to 5 carbon atoms, a fluorine atom, fluorinated lower alkyl groups of 1 to 5 carbon atoms, and an oxygen atom (=O).

The basic ring structure of the "aliphatic cyclic group" excluding substituent groups is not limited to groups consisting of carbon and hydrogen (hydrocarbon groups), although a hydrocarbon group is preferable. Furthermore, the "hydrocarbon group" may be either saturated or unsaturated, but is preferably saturated. The aliphatic cyclic group is preferably a polycyclic group.

Specific examples of this type of aliphatic cyclic group include groups in which one or more hydrogen atoms have been removed from a polycycloalkane such as a monocycloalkane, bicycloalkane, tricycloalkane or tetracycloalkane which may or may not be substituted with a lower alkyl group, a fluorine atom or a fluoroalkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane.

Specific examples of suitable aliphatic branched acid dissociable, dissolution inhibiting groups include a tert-butyl group and a tert-amyl group.

Furthermore, examples of acid dissociable, dissolution inhibiting groups that contain an aliphatic cyclic group include groups that contain a tertiary carbon atom within the ring skeleton of a cycloalkyl group, and specific examples include a 2-methyl-2-adamantyl group or 2-ethyl-2-adamantyl group. Other possible groups include those that contain an aliphatic cyclic group such as an adamantyl group, and a branched alkylene group that contains a tertiary carbon atom and is bonded to the aliphatic cyclic group, such as the group shown within the structural unit represented by a general formula shown below.

[Chemical Formula 6]

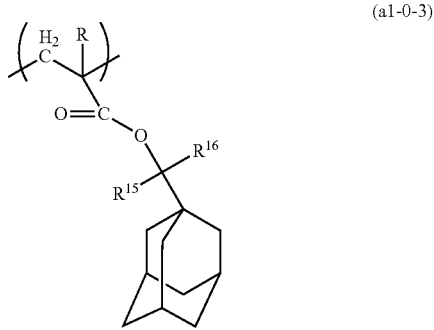

(a1-0-3)

wherein, R is as defined above, and $R^{15}$ and $R^{16}$ represent alkyl groups (which may be either linear or branched groups, and preferably have 1 to 5 carbon atoms).

Furthermore, the above alkoxyalkyl groups are preferably groups represented by general formula (p1) shown below.

[Chemical Formula 7]

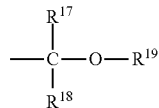

(p1)

wherein, $R^{17}$ and $R^{18}$ each independently represents a linear or branched alkyl group or a hydrogen atom, and $R^{19}$ represents a linear, branched or cyclic alkyl group. Furthermore, $R^{17}$ and $R^{19}$ may be bonded together at their respective terminals to form a ring The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic group which preferably has 1 to 15 carbon atoms, and may be any of linear, branched or cyclic.

When $R^{19}$ represents a linear or branched group, it preferably has 1 to 5 carbon atoms, and is preferably a methyl group or an ethyl group, and a methyl group is most preferable.

When $R^{19}$ represents a cycloalkyl group, it preferably has 4 to 15 carbon atoms, more preferably 4 to 12 carbon atoms, and most preferably 5 to 10 carbon atoms. As examples of the cyclic group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be exemplified. Specific examples include groups in which one or more hydrogen atoms have been removed from monocycloalkanes such as cyclopentane and cyclohexane, and groups in which one or more hydrogen atoms have been removed from polycycloalkanes such as adamantane, norbornane, isobornane, tricyclodecane and tetracyclododecane. Of these, a group in which one or more hydrogen atoms have been removed from adamantane is preferable.

Furthermore, in the above formula, $R^{17}$ and $R^{19}$ may each independently represent an alkylene group of 1 to 5 carbon atoms, wherein the terminal of $R^{19}$ and the terminal of $R^{17}$ are bonded together.

In such cases, a cyclic group is formed of the groups $R^{17}$ and $R^{19}$, the oxygen atom bonded to $R^{19}$, and the carbon atom that is bonded to this oxygen atom and the group $R^{17}$. This type of cyclic group is preferably a 4- to 7-membered ring, and more preferably 4- to 6-membered rings. Specific examples of these cyclic groups include a tetrahydropyranyl group and a tetrahydrofuranyl group.

In the general formula (a1-0-2), R is as defined above. The group $X^2$ is as described for $X^1$ in the formula (a1-0-1).

$Y^2$ is an alkylene group of 1 to 4 carbon atoms or a divalent aliphatic cyclic group. As the aliphatic cyclic group, the same as those exemplified above in connection with the explanation of "aliphatic cyclic group" can be used, except that two hydrogen atoms have been removed therefrom.

Specific examples of the structural unit (a1) include structural units represented by general formulas (a1-1) to (a1-4) shown below.

[Chemical Formula 8]

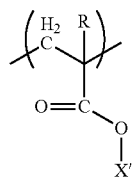

(a1-1)

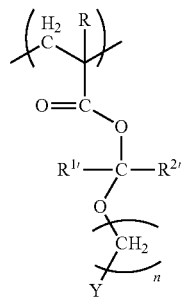

(a1-2)

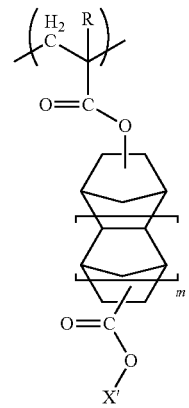

(a1-3)

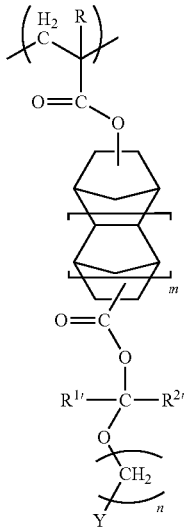

(a1-4)

wherein X' represents a tertiary alkyl ester-type acid dissociable, dissolution inhibiting group; Y represents a lower alkyl group of 1 to 5 carbon atoms or an aliphatic cyclic group; n represents an integer of 0 to 3; m represents 0 or 1; R is as defined above; and $R^1$, and $R^2$, each independently represents a hydrogen atom or a lower alkyl group of 1 to carbon atoms.

It is preferable that at least one of $R^1$, and $R^2$, represent a hydrogen atom, and it is more preferable that both of $R^1$, and $R^2$, represent a hydrogen atom. n is preferably 0 or 1.

Examples of the tertiary alkyl ester-type acid dissociable, dissolution inhibiting group for X' are the same as the tertiary alkyl ester-type acid dissociable, dissolution inhibiting groups exemplified above for $X^1$.

Examples of the aliphatic cyclic group for Y are the same as those exemplified above in connection with the explanation of "aliphatic cyclic group".

Specific examples of structural units represented by general formula (a1-1) to (a1-4) are shown below.

[Chemical Formula 9]

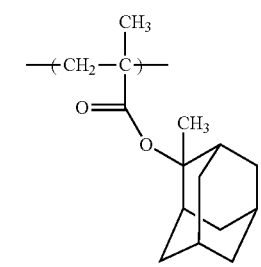
(a1-1-1)

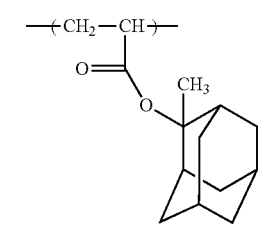
(a1-1-2)

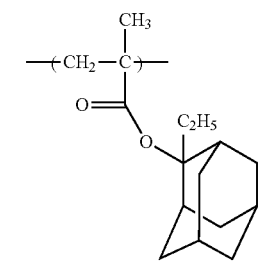
(a1-1-3)

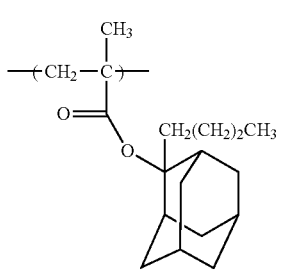
(a1-1-4)

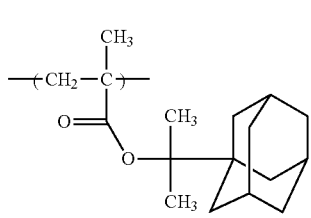
(a1-1-5)

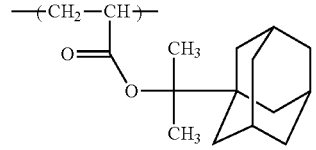
(a1-1-6)

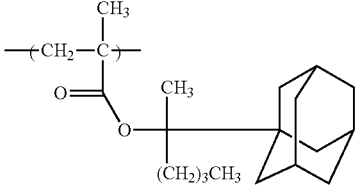
(a1-1-7)

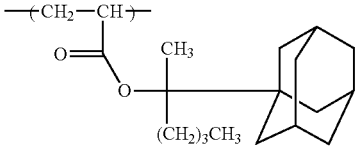
(a1-1-8)

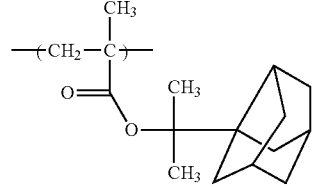
(a1-1-9)

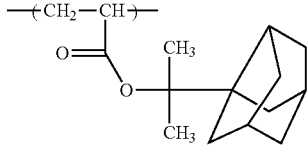
(a1-1-10)

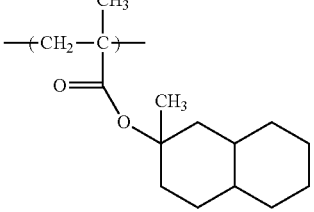
(a1-1-11)

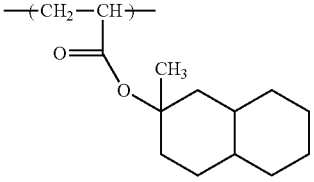
(a1-1-12)

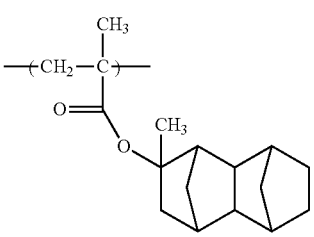
(a1-1-13)

(a1-1-14) 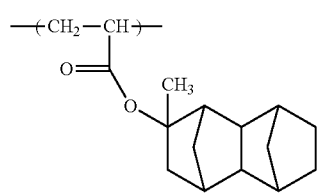
(a1-1-15) 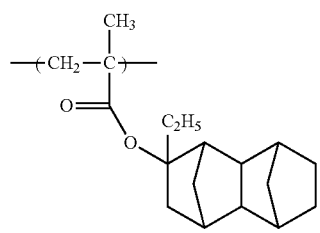
(a1-1-16) 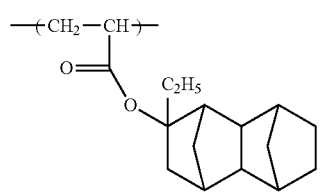
[Chemical Formula 10]
(a1-1-17) 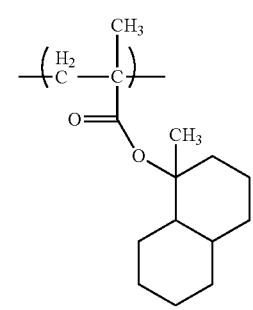
(a1-1-18) 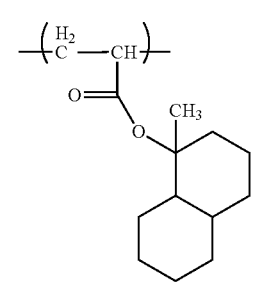
(a1-1-19) 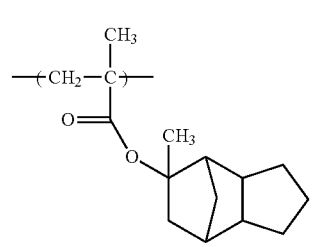
(a1-1-20) 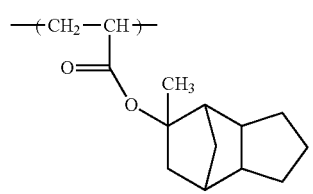
(a1-1-21) 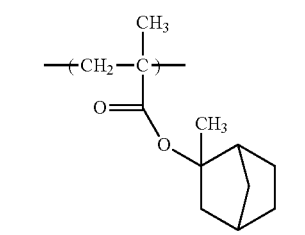
(a1-1-22) 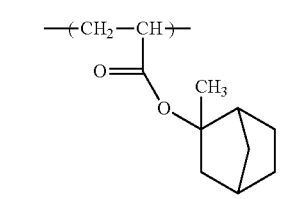
(a1-1-23) 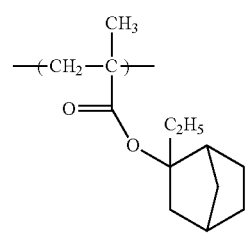
(a1-1-24) 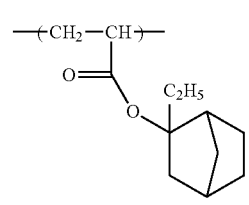
(a1-1-25) 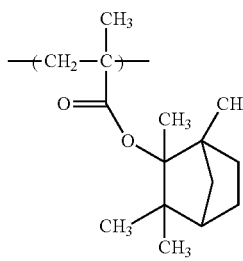
(a1-1-26) 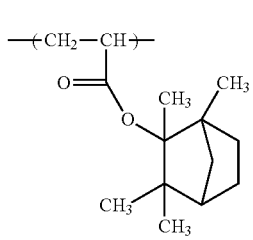

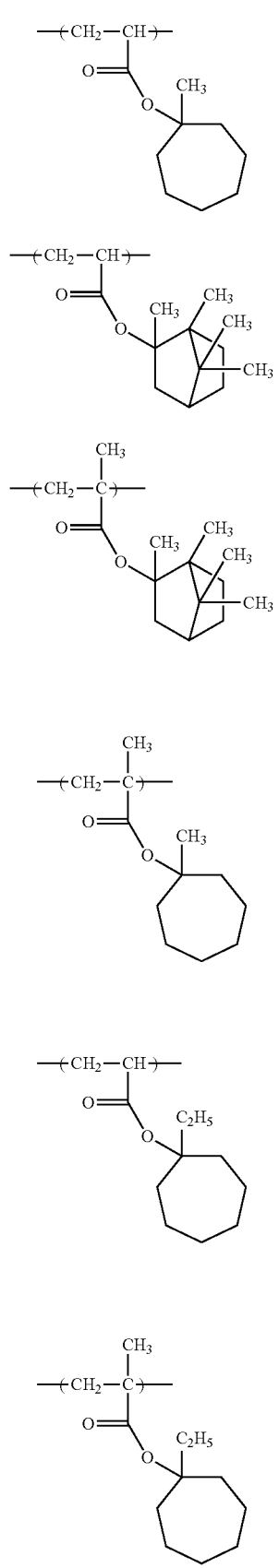
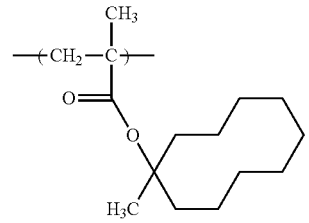
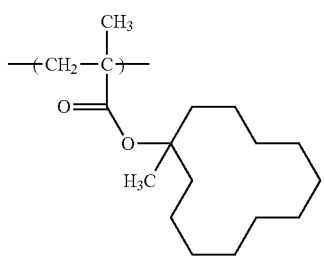
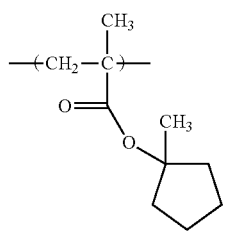
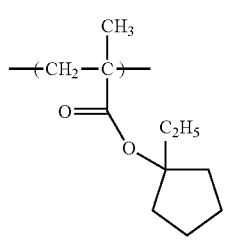
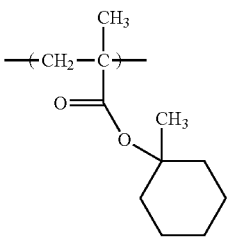
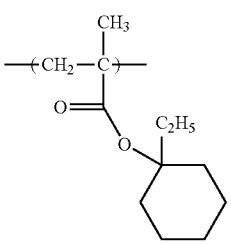

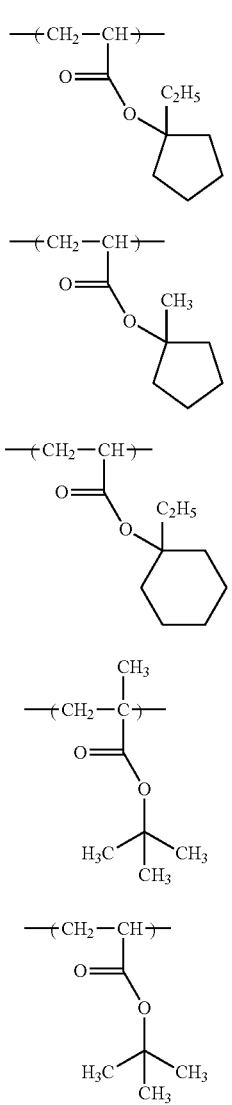
(a1-1-39)
(a1-1-40)
(a1-1-41)
(a1-1-42)
(a1-1-43)
(a1-1-44)
(a1-1-45)
[Chemical Formula 12]
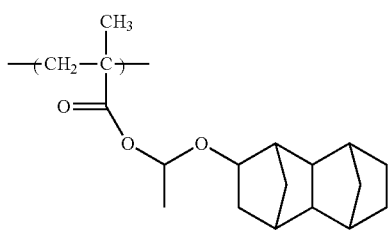
(a1-2-1)
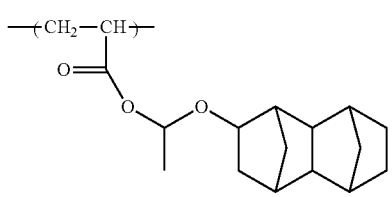
(a1-2-2)
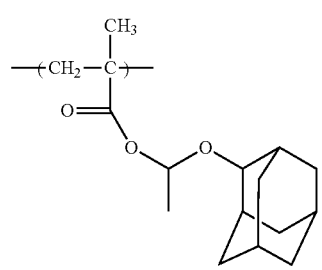
(a1-2-3)
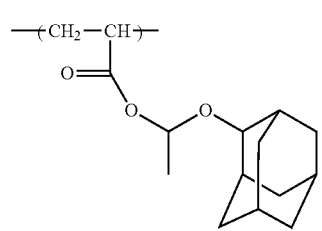
(a1-2-4)
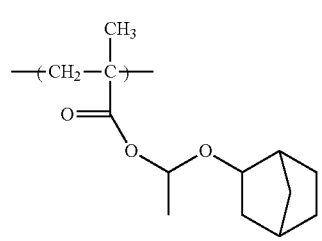
(a1-2-5)
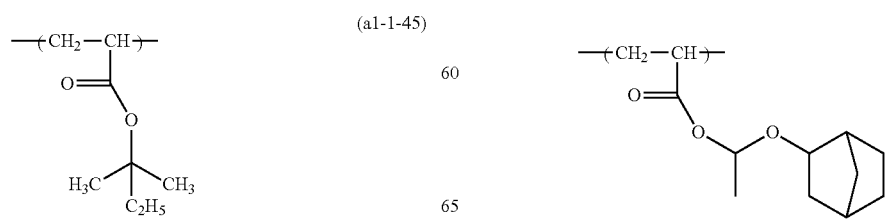
(a1-2-6)

[Chemical Formula 13]
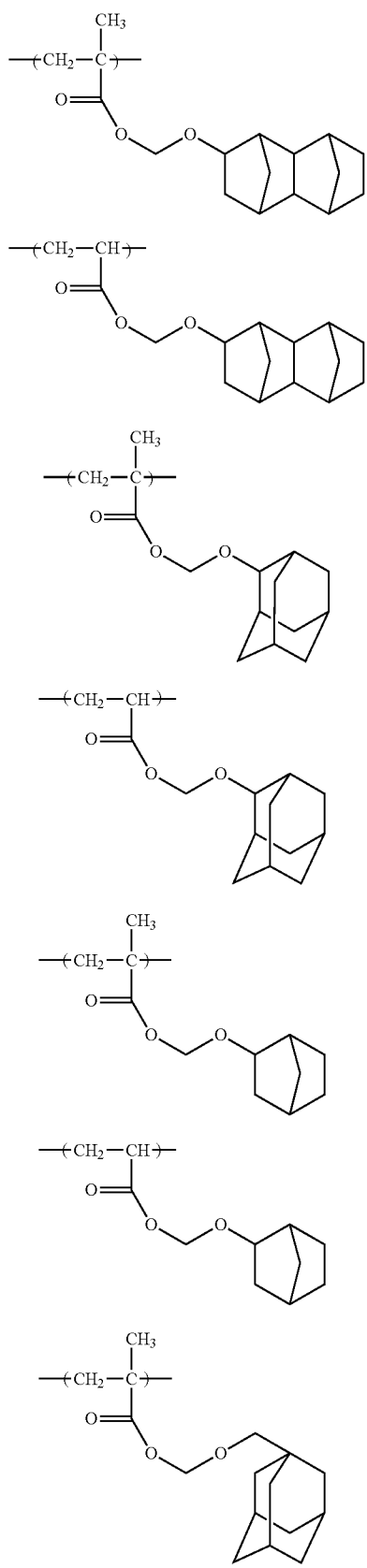
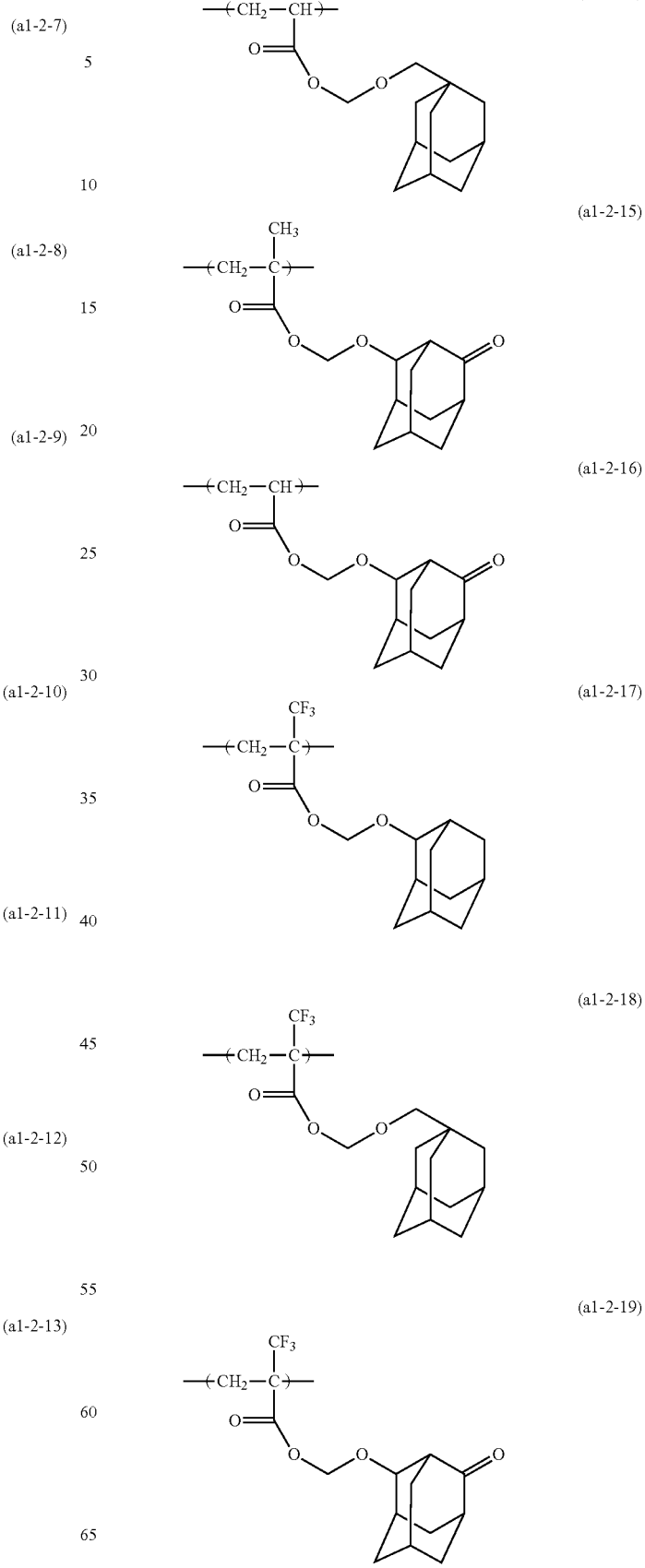

(a1-2-20) 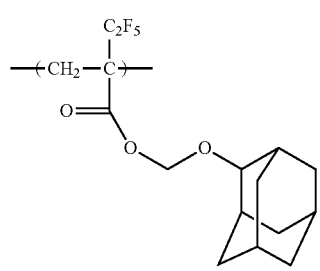
(a1-2-21) 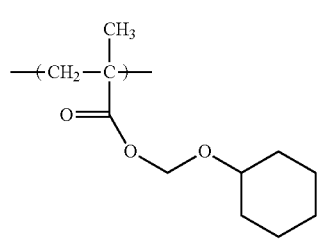
[Chemical Formula 14]
(a1-2-22) 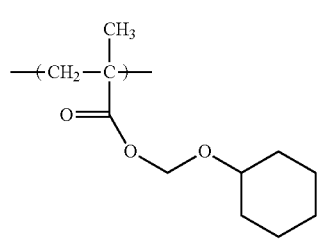
(a1-2-23) 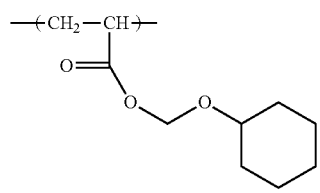
(a1-2-24) 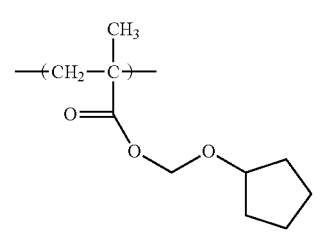
(a1-2-25) 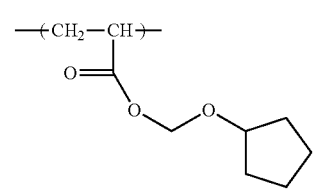
(a1-2-26) 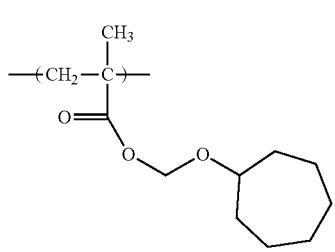
(a1-2-27) 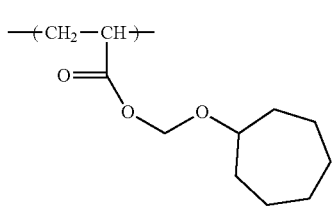
(a1-2-28) 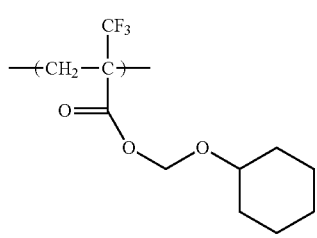
(a1-2-29) 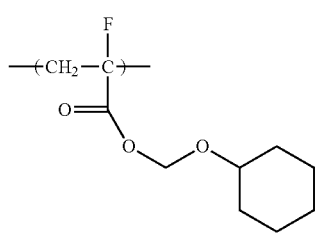
(a1-2-30) 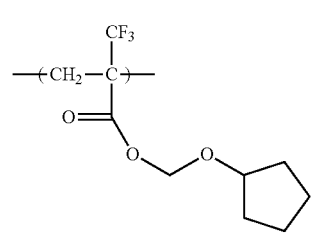
(a1-2-31) 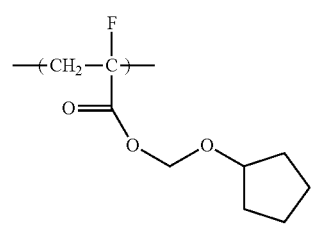
(a1-2-32) 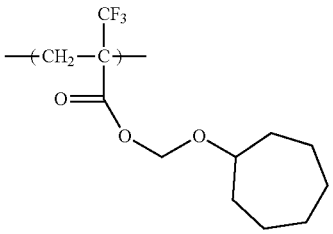
(a1-2-33) 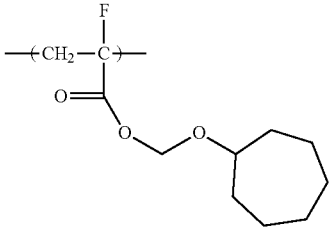

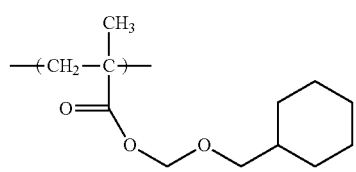
(a1-2-34)
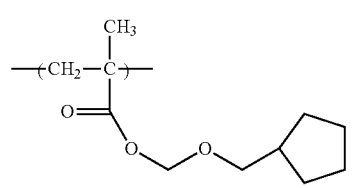
(a1-2-35)
[Chemical Formula 15]
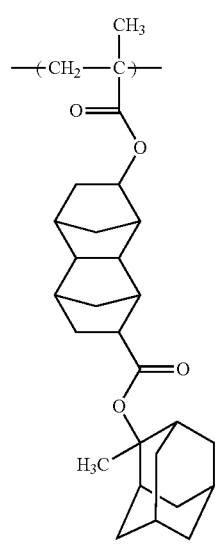
(a1-3-1)
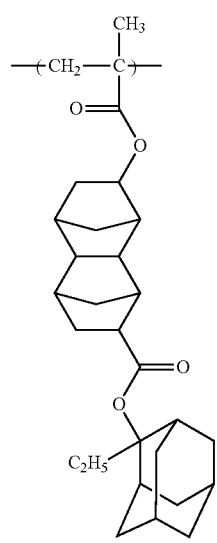
(a1-3-2)
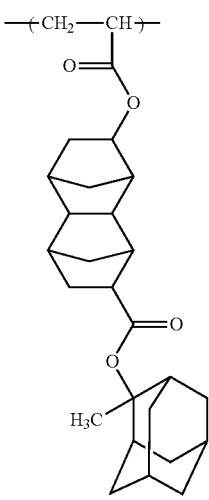
(a1-3-3)
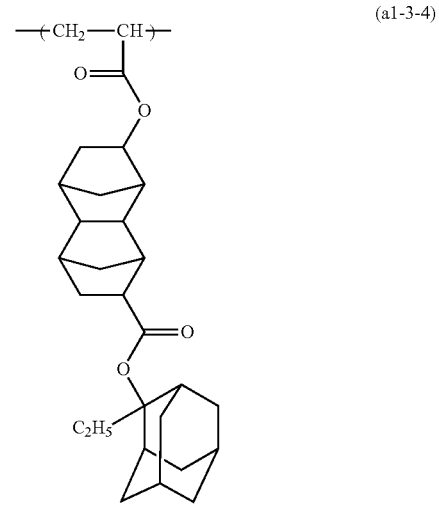
(a1-3-4)
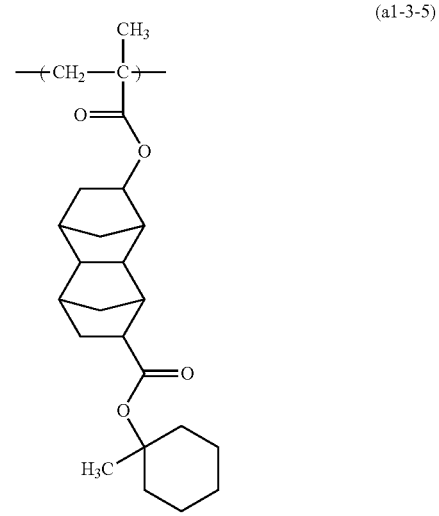
(a1-3-5)

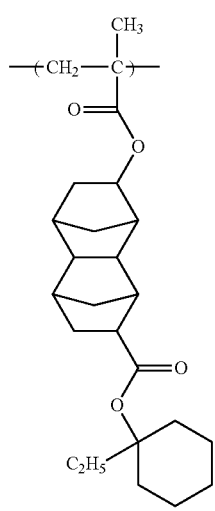
(a1-3-6)
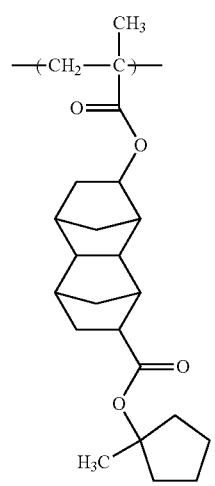
(a1-3-7)
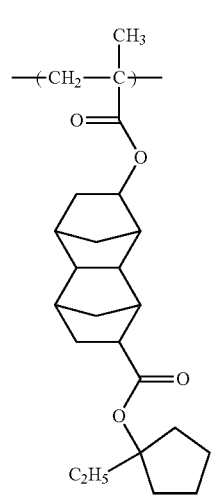
(a1-3-8)
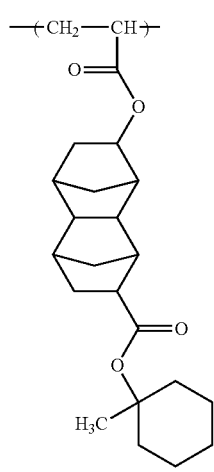
(a1-3-9)
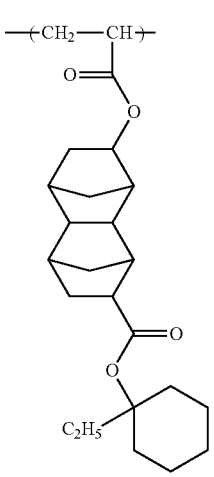
(a1-3-10)
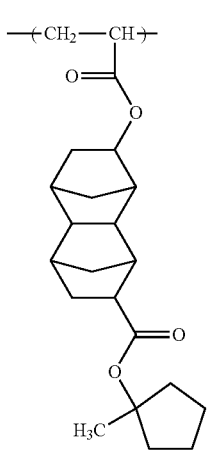
(a1-3-11)

(a1-3-12)
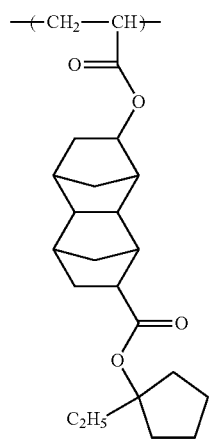
[Chemical Formula 16]
(a1-3-13)
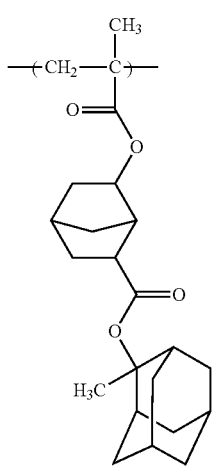
(a1-3-14)
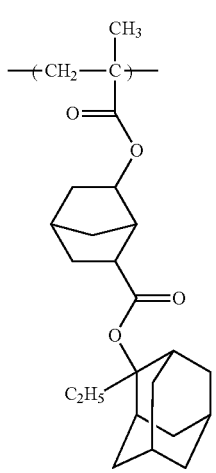
(a1-3-15)
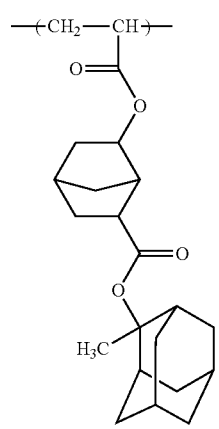
(a1-3-16)
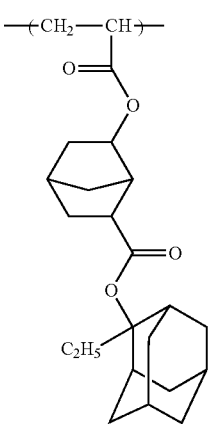
(a1-3-17)
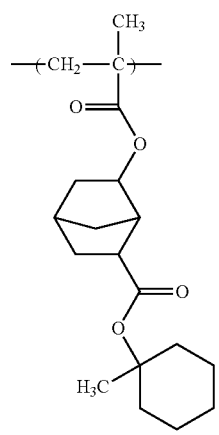

(a1-3-18)
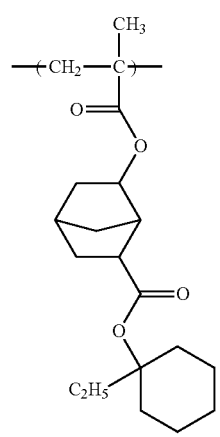
(a1-3-19)
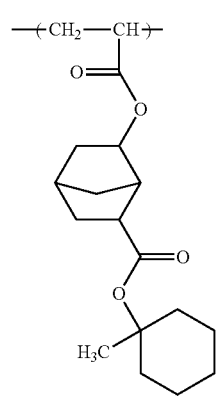
(a1-3-20)
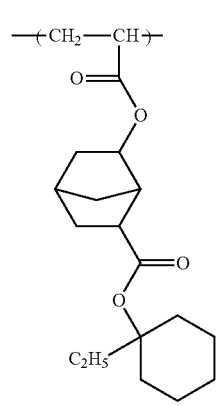
(a1-3-21)
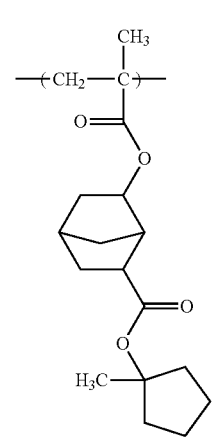
(a1-3-22)
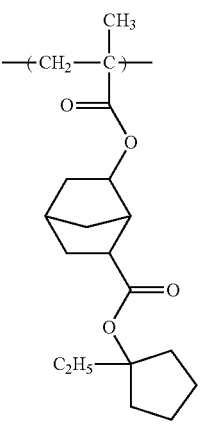
(a1-3-23)
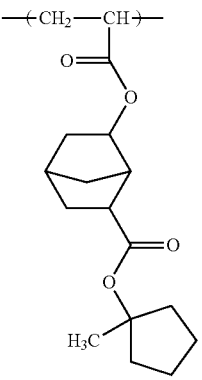
(a1-3-24)
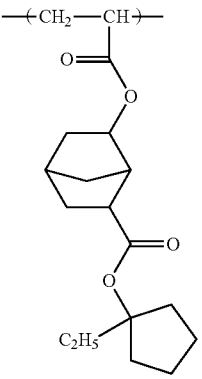
[Chemical Formula 17]
(a1-4-1)
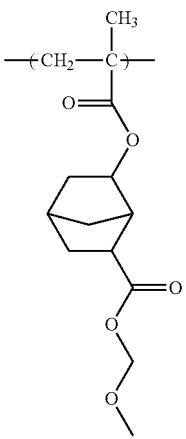

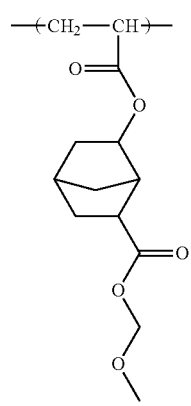 (a1-4-2)
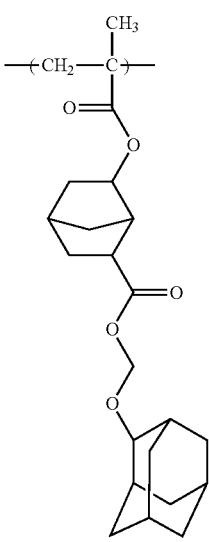 (a1-4-5)
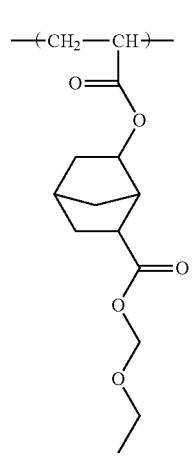 (a1-4-3)
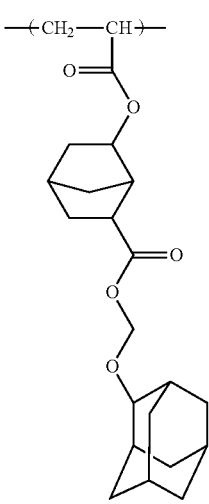 (a1-4-6)
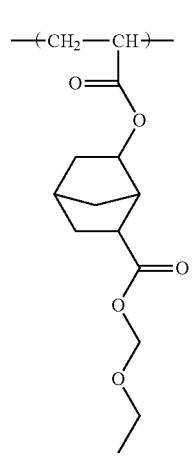 (a1-4-4)
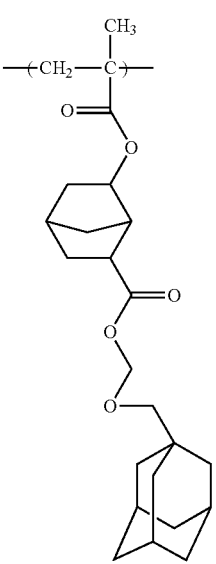 (a1-4-7)

(a1-4-8)
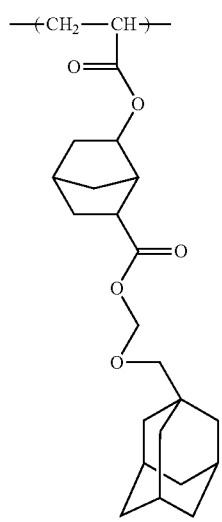
(a1-4-9)
(a1-4-10)
(a1-4-11)
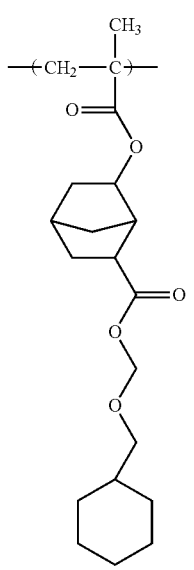
(a1-4-12)
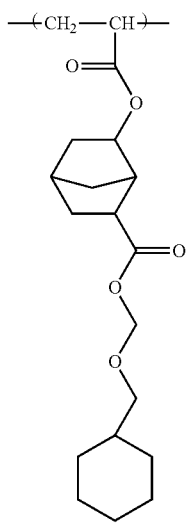
(a1-4-13)
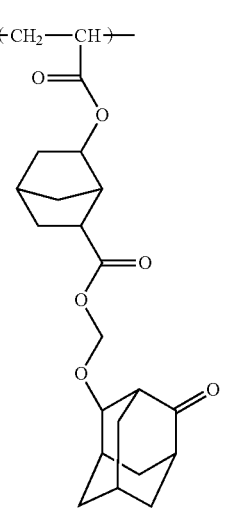

(a1-4-14)
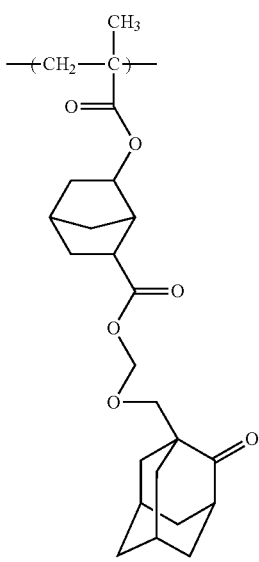
(a1-4-15)
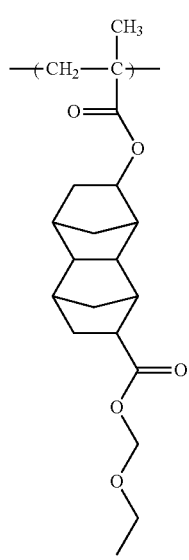
[Chemical Formula 18]
(a1-4-16)
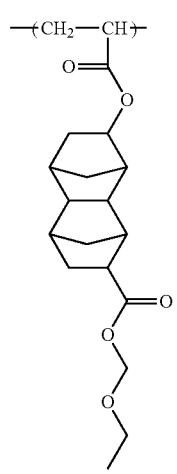
(a1-4-17)
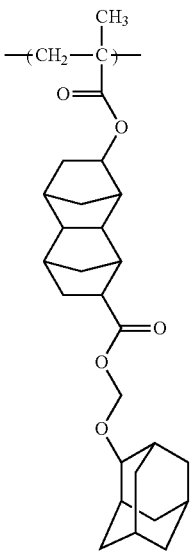
(a1-4-18)
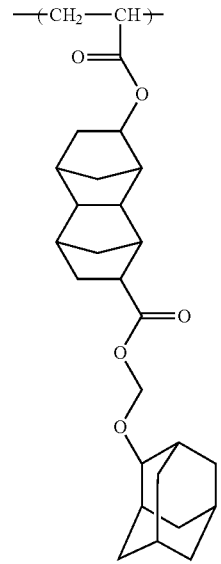
(a1-4-19)
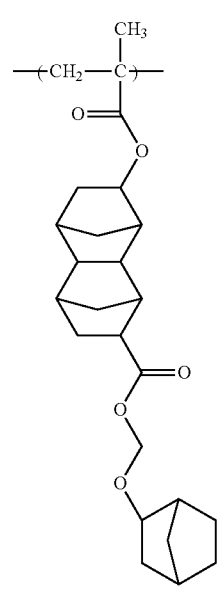

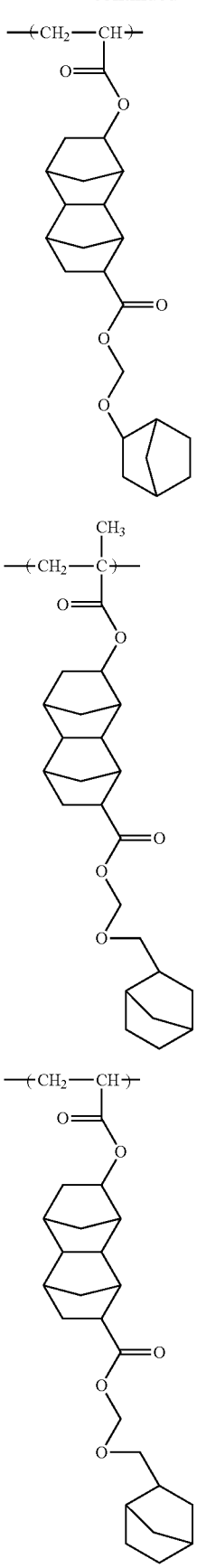

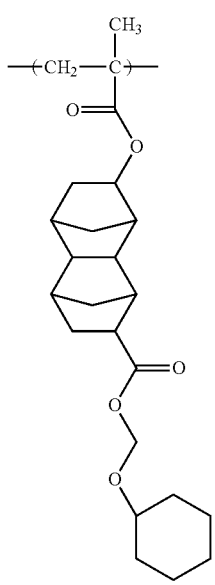
(a1-4-25)
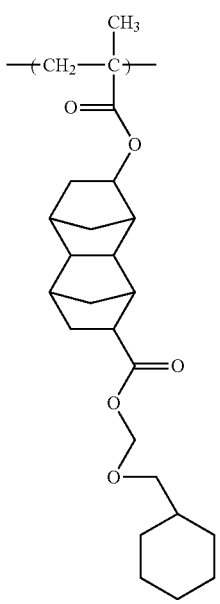
(a1-4-27)
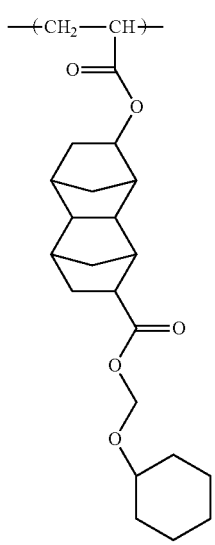
(a1-4-26)
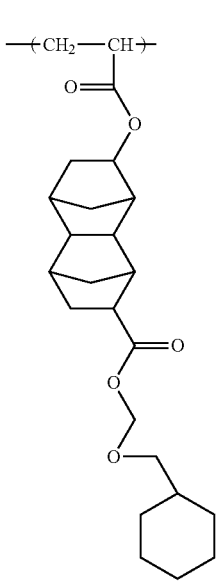
(a1-4-28)

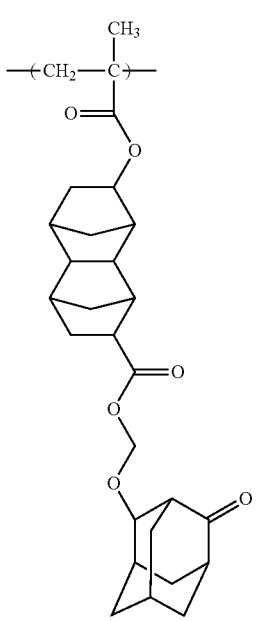

(a1-4-29)

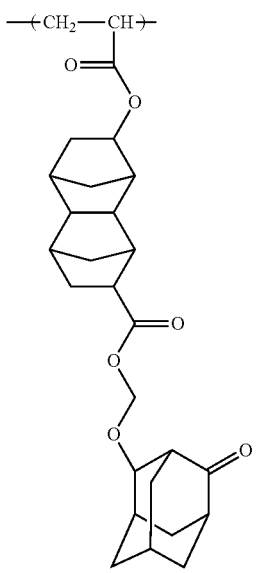

(a1-4-30)

As the structural unit (a1), either one type of structural unit may be used alone, or a combination of two or more different structural units may be used.

Among these, structural units represented by general formula (a1-1) are preferable. More specifically, at least one structural unit selected from the group consisting of structural units represented by formulas (a1-1-1) to (a1-1-6) and (a1-1-35) to (a1-1-41) is more preferable.

Further, as the structural unit (a1), structural units represented by general formula (a1-1-01) shown below which includes the structural units represented by formulas (a1-1-1) to (a1-1-4), and structural units represented by general formula (a1-1-02) shown below which includes the structural units represented by formulas (a1-1-35) to (a1-1-41) are preferable.

[Chemical Formula 19]

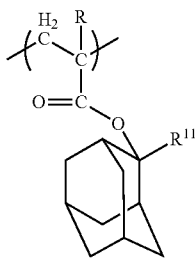

(a1-1-01)

wherein R represents a hydrogen atom, a halogen atom, a lower alkyl group or a halogenated lower alkyl group; and $R^{11}$ represents a lower alkyl group.

[Chemical Formula 20]

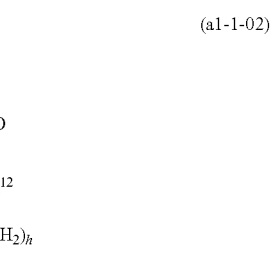

(a1-1-02)

wherein R represents a hydrogen atom, a halogen atom, a lower alkyl group or a halogenated lower alkyl group; $R^{12}$ represents a lower alkyl group; and h represents an integer of 1 to 3.

In general formula (a1-1-01), R is as defined above. The lower alkyl group for $R^{11}$ is the same as the lower alkyl group for R above, and is preferably a methyl group or an ethyl group.

In general formula (a1-1-02), R is as defined above. The lower alkyl group for $R^{12}$ is the same as the lower alkyl group for R above, and is preferably a methyl group or an ethyl group, and most preferably an ethyl group. h is preferably 1 or 2, and most preferably 2.

Further, as examples of structural units preferably used, structural units (a0) in which the hydrogen atom of the hydroxyl group of the fluorinated hydroxyalkyl group is substituted with an acid dissociable, dissolution inhibiting group can be mentioned. Specific examples include structural units represented by general formulas (a1-5) to (a1-7) shown below. Among these, structural units represented by general formula (a1-6) are preferable.

[Chemical Formula 21]

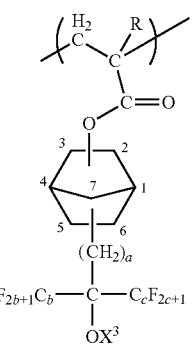

(a1-5)

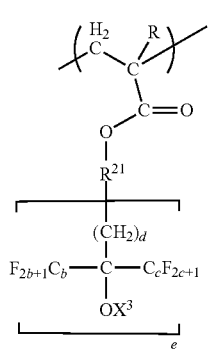

(a1-6)

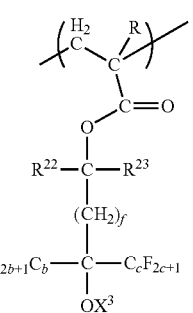

(a1-7)

In general formulas above, R, a, b, c, d, e and f are respectively the same as R, a, b, c, d, e and f in general formulas (a0-1) to (a0-3) above.

In general formulas above, $X^3$ is the same as $X^1$ in general formula (a1-0-1) above. As $X^3$, an alkoxyalkyl group is preferable, a group represented by general formula (p1) above is more preferable, and a methoxymethyl group is particularly desirable.

In the resin (A1), the amount of the structural unit (a1) based on the combined total of all structural units constituting the resin (A1) is preferably 10 to 80 mol %, more preferably 20 to 70 mol %, and still more preferably 25 to 60 mol %. By making the amount of the structural unit (a1) at least as large as the lower limit of the above-mentioned range, a pattern can be easily formed using a resist composition prepared from the resin (A1). On the other hand, by making the amount of the structural unit (a1) no more than the upper limit of the above-mentioned range, a good balance can be achieved with the other structural units.

Structural Unit (a2)

The resin (A1) preferably has a structural unit (a2) derived from an acrylate ester having a lactone-containing cyclic group, as well as the structural unit (a1).

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the resin (A1) is used for forming a resist film, the lactone-containing cyclic group of the structural unit (a2) is effective in improving the adhesion between the resist film and the substrate, increasing the hydrophilicity, and enhancing the affinity for a developing solution.

As the structural unit (a2), there is no particular limitation, and an arbitrary structural unit may be used.

Specific examples of lactone-containing monocyclic groups include groups in which one hydrogen atom has been removed from γ-butyrolactone. Specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 22]

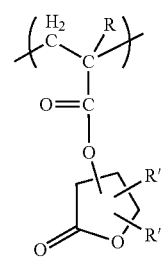

(a2-1)

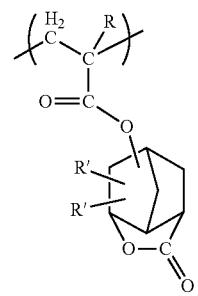

(a2-2)

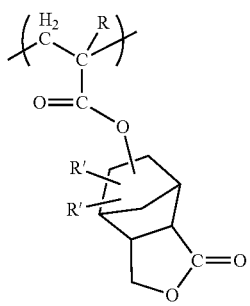

(a2-3)

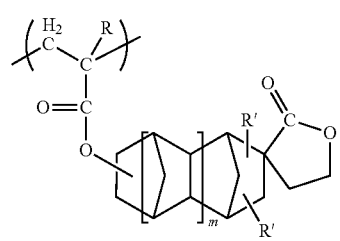

(a2-4)

(a2-5)

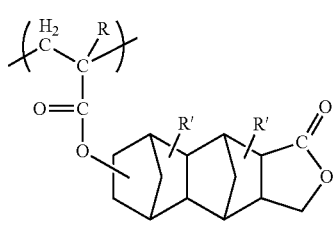

wherein R represents a hydrogen atom, a halogen atom, a lower alkyl group or a halogenated lower alkyl group; R' represents a hydrogen atom, a lower alkyl group or an alkoxy group of 1 to 5 carbon atoms; and m represents 0 or 1.

In general formulas (a2-1) to (a2-5), R is the same as R in the structural unit (a1).

The lower alkyl group for R' is the same as the lower alkyl group for R in the structural unit (a1).

In the structural units represented by general formulas (a2-1) to (a2-5), in consideration of industrial availability, R' is preferably a hydrogen atom.

Specific examples of structural units represented by general formulas (a2-1) to (a2-5) above are shown below.

[Chemical Formula 23]

(a2-1-1)

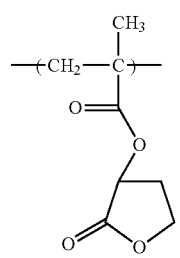

(a2-1-2)

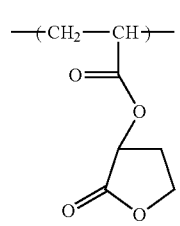

(a2-1-3)

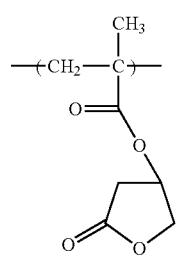

(a2-1-4)

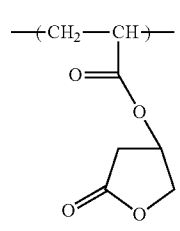

(a2-1-5)

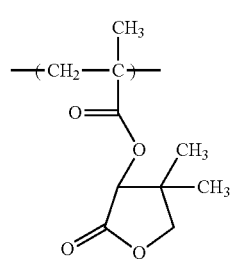

(a2-1-6)

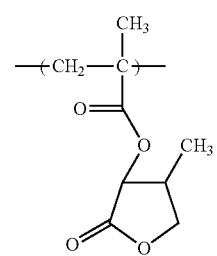

[Chemical Formula 24]

(a2-2-1)

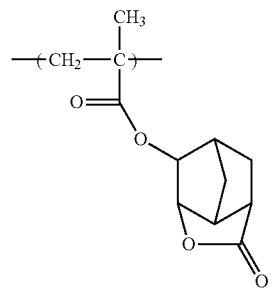

(a2-2-2)

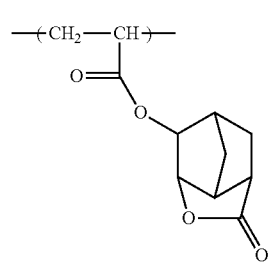

(a2-2-3)

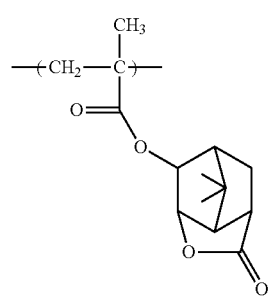

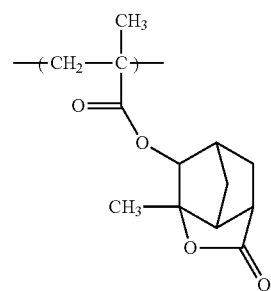 (a2-2-4)
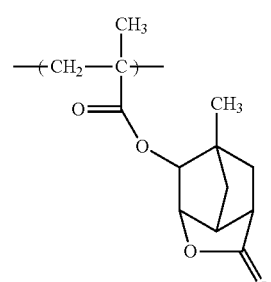 (a2-2-5)
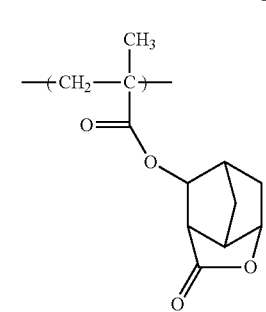 (a2-2-6)
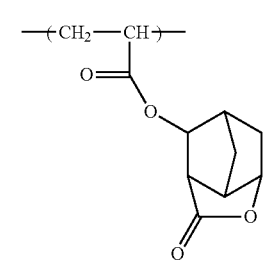 (a2-2-7)
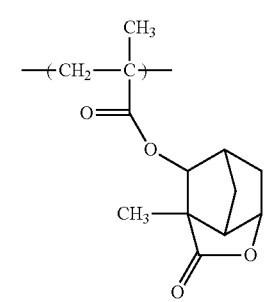 (a2-2-8)
[Chemical Formula 25]
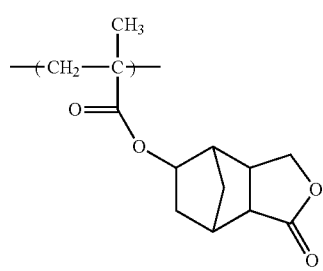 (a2-3-1)
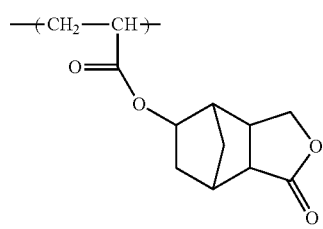 (a2-3-2)
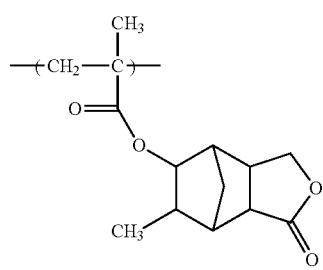 (a2-3-3)
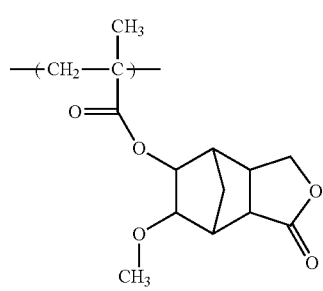 (a2-3-4)
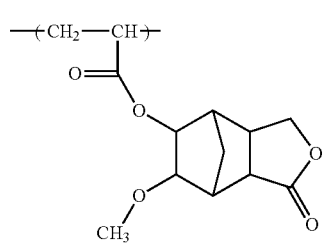 (a2-3-5)
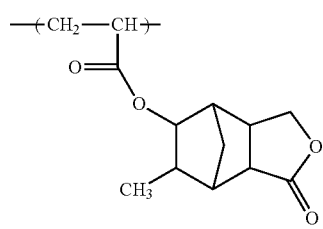 (a2-3-6)

(a2-3-7)
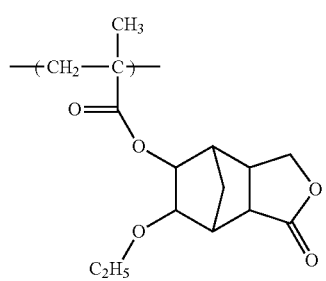
(a2-3-8)
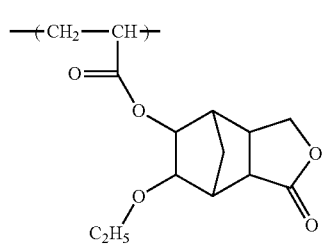
(a2-3-9)
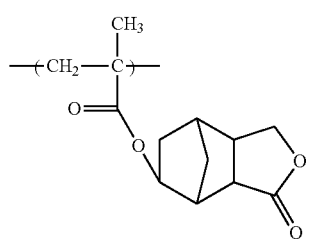
(a2-3-10)
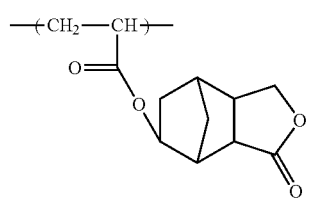
[Chemical Formula 26]
(a2-4-1)
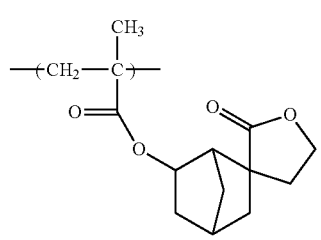
(a2-4-2)
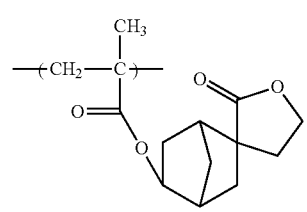
(a2-4-3)
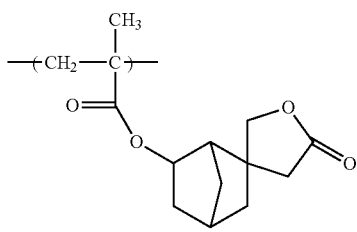
(a2-4-4)
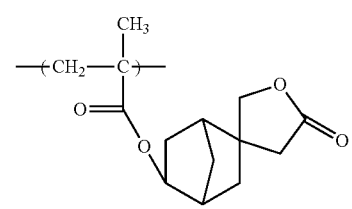
(a2-4-5)
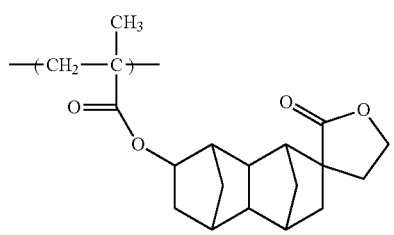
(a2-4-6)
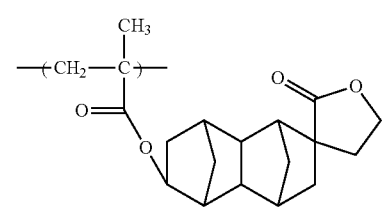
(a2-4-7)
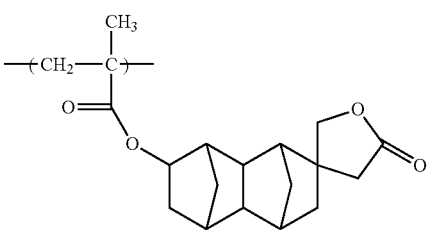
(a2-4-8)
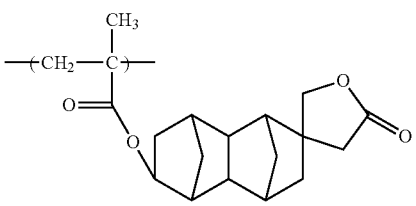
(a2-4-9)
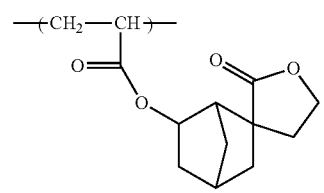

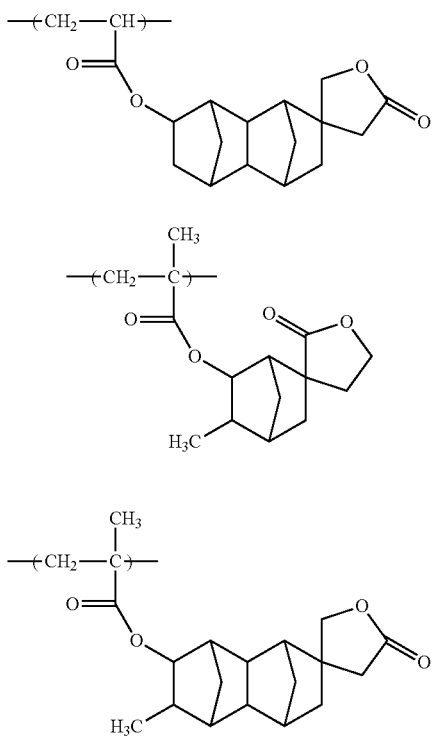
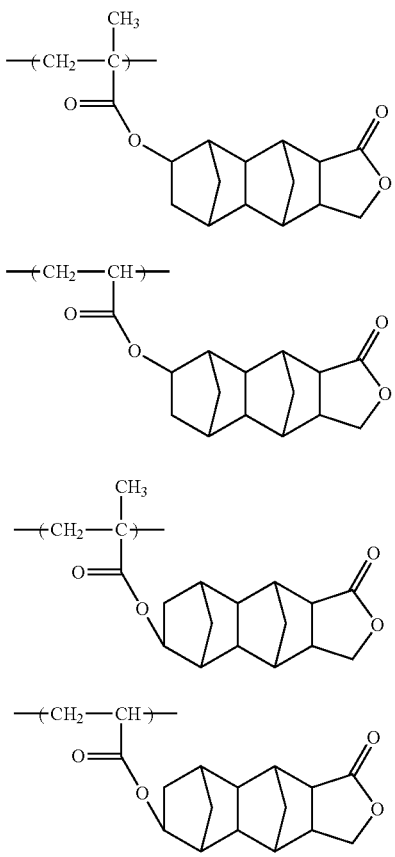
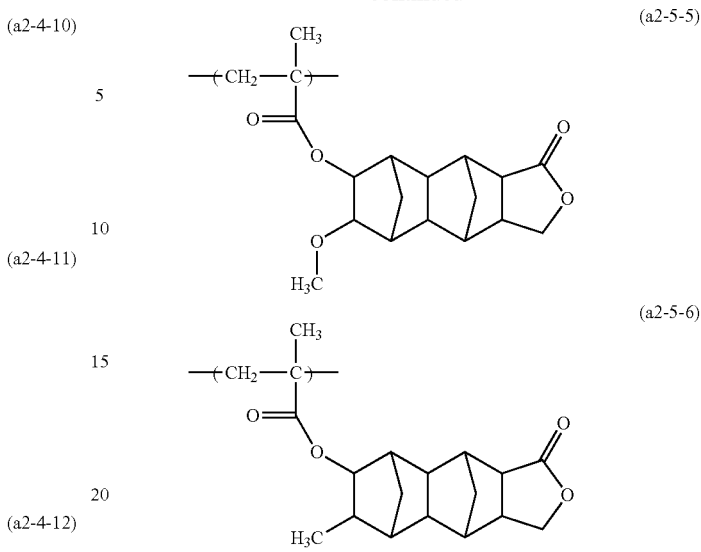

Of these, at least one structural unit selected from the group consisting of formulas (a2-1) to (a2-5) is preferable, and at least one structural unit selected from the group consisting of formulas (a2-1) to (a2-3) is more preferable. Specifically, it is preferable to use at least one structural unit selected from the group consisting of formulas (a2-1-1), (a2-1-2), (a2-2-1), (a2-2-2), (a2-3-1), (a2-3-2), (a2-3-9) and (a2-3-10).

In the resin (A1), as the structural unit (a2), one type of structural unit may be used, or two or more types may be used in combination.

In the resin (A1), the amount of the structural unit (a2) based on the combined total of all structural units constituting the resin (A1) is preferably 5 to 70 mol %, more preferably 10 to 60 mol %, and still more preferably 15 to 60 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, a good balance can be achieved with the other structural units.

Structural Unit (a3)

The resin (A1) preferably has a structural unit (a3) derived from an acrylate ester having a polar group-containing aliphatic hydrocarbon group (excluding structural units classified as structural unit (a0)), as well as the structural unit (a1) and the structural unit (a2). By including the structural unit (a3), the hydrophilicity of the resin (A1) is improved, and hence, the affinity of the resin (A1) for a developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers.

Of the various possibilities, structural units derived from acrylate esters having an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of suitable polycyclic groups include groups in which one or more hydrogen atoms have been removed from a bicycloalkane, tricycloalkane or tetracycloalkane or the like. Specific examples include groups in which one or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, groups in which two or more hydrogen atoms have been removed from norbornane, and groups in which two or more hydrogen atoms have been removed from tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit represented by general formula (a) above in which X is a (linear or branched) chain hydroxyalkyl group.

On the other hand, when the hydrocarbon group is a polycyclic group, structural units represented by formulas (a3-1) and (a3-2) shown below are preferable.

[Chemical Formula 28]

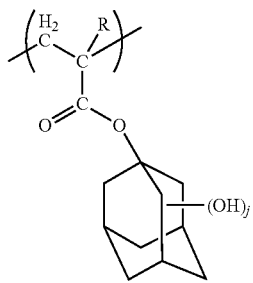

(a3-1)

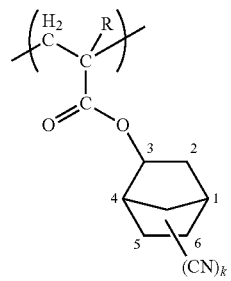

(a3-2)

wherein R is as defined above; j is an integer of 1 to 3; and k is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is particularly desirable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

As the structural unit (a3), one type of structural unit may be used, or two or more types may be used in combination.

In the resin (A1), the amount of structural unit (a3) based on the combined total of all structural units constituting the resin (A1) is preferably 5 to 50 mol %, more preferably 5 to 40 mol %, and still more preferably 5 to 25 mol %.

Structural Unit (a4)

The resin (A1) may further contain a structural unit (a4) which is other than the above-mentioned structural units (a0) to (a3), as long as the effects of the present invention are not impaired.

As the structural unit (a4), any other structural unit which cannot be classified as one of the above structural units (a0) to (a3) can be used without any particular limitations, and any of the multitude of conventional structural units used within resist resins for ArF excimer lasers or KrF excimer lasers (and particularly for ArF excimer lasers) can be used.

As the structural unit (a4), a structural unit derived from an acrylate ester having a non-acid-dissociable aliphatic polycyclic group is preferable. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may have at least one of the hydrogen atoms substituted with a linear or branched alkyl group of 1 to 5 carbon atoms.

Specific examples of the structural unit (a4) include units with structures represented by general formulas (a4-1) to (a4-5) shown below.

[Chemical Formula 29]

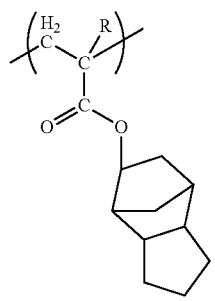

(a4-1)

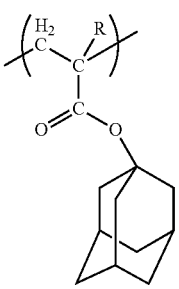

(a4-2)

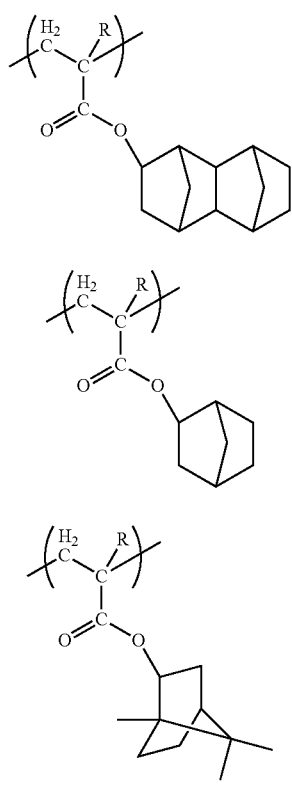

wherein R is as defined above.

When the structural unit (a4) is included in the resin (A1), the amount of the structural unit (a4) based on the combined total of all the structural units that constitute the resin (A1) is typically within a range from 1 to 30 mol %, and preferably from 10 to 20 mol %.

In the present invention, the resin (A1) is preferably a copolymer including at least the structural units (a0) and (a1). Examples of such a copolymer include a copolymer consisting of the structural units (a0) and (a1), a copolymer consisting of the structural units (a0), (a1) and (a2), and a copolymer consisting of the structural units (a0), (a1), (a2) and (a3).

In the present invention, as the resin (A1), copolymers including a combination of 2 to 4 structural units represented by formulas (A1-11) to (A1-15) shown below are particularly desirable.

[Chemical Formula 30]

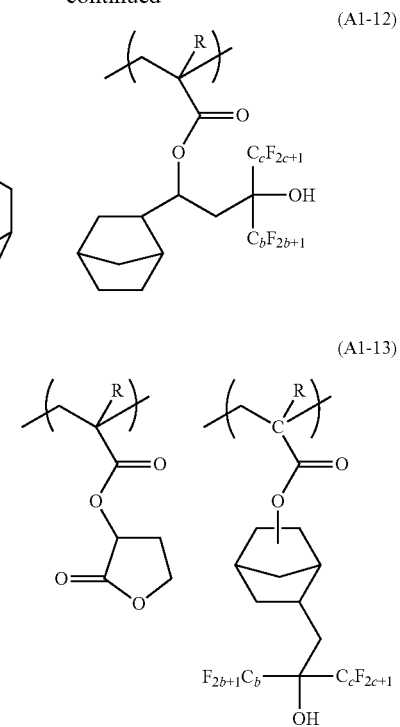

[Chemical Formula 31]

[Chemical Formula 32]

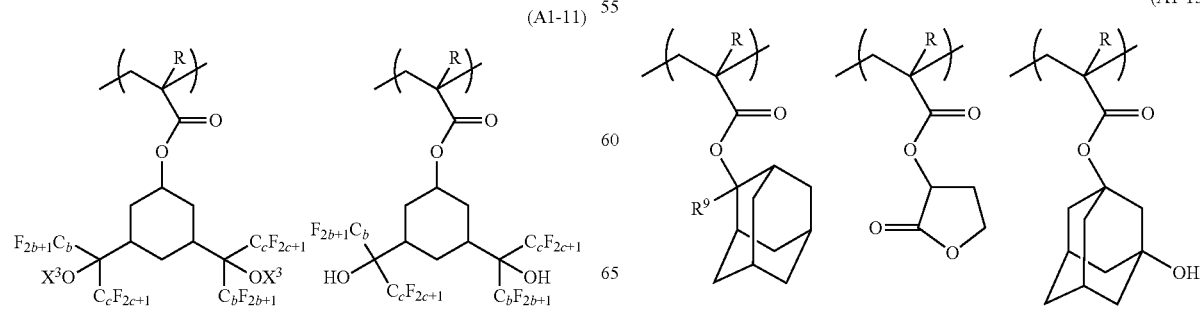

-continued

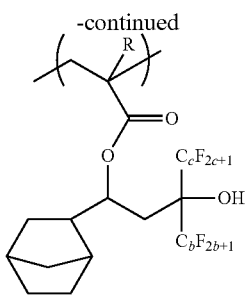

In general formulas above, $X^3$ is the same as $X^3$ in general formula (a1-6) above.

In general formulas above, R, a, b, c, d, e and f are respectively the same as R, a, b, c, d, e and f in general formulas (a0-1) to (a0-3) above.

$R^9$ represents a lower alkyl group, and is the same as the lower alkyl group for R. $R^9$ is preferably a methyl group or an ethyl group, and is most preferably an ethyl group.

The resin (A1) can be obtained, for example, by a conventional radical polymerization or the like of the monomers corresponding with each of the structural units, using a radical polymerization initiator such as azobisisobutyronitrile (AIBN).

Furthermore, in the resin (A1), by using a chain transfer agent such as HS—$CH_2$—$CH_2$—$CH_2$—$C(CF_3)_2$—OH, a —$C(CF_3)_2$—OH group can be introduced at the terminals of the resin (A1). Such a copolymer having introduced a hydroxyalkyl group in which some of the hydrogen atoms of the alkyl group are substituted with fluorine atoms is effective in decreasing developing defects and LER (line edge roughness: unevenness of the side walls of a line pattern).

The weight average molecular weight (Mw) (the polystyrene equivalent value determined by gel permeation chromatography) of the resin (A1) is not particularly limited, but is preferably 2,000 to 30,000, more preferably 2,000 to 10,000, and still more preferably 3,000 to 7,000. By making the weight average molecular weight within the above-mentioned range, the resin (A1) exhibits satisfactory dissolution rate can be achieved in an alkali developing solution, and becomes preferable in terms of achieving high resolution. There is a tendency that satisfactory properties can be obtained when the molecular weight is smaller within the above-mentioned range.

Further, the dispersity (Mw/Mn) is preferably 1.0 to 5.0, more preferably 1.0 to 2.5.

In the present invention, it is necessary that the amount of the resin (A1) within the component (A) be within the range from 0.1 to 50% by weight. By making the amount of the resin (A1) 0.1% by weight or more, the resistance to an immersion medium becomes satisfactory. On the other hand, by making the amount of the resin (A1) no more than 50% by weight, the balance with the resin (A2) becomes satisfactory, and satisfactory lithography properties can be achieved.

The amount of the resin (A1) within the component (A) is preferably from 0.1 to 25% by weight, more preferably 0.1 to 20% by weight, and most preferably 0.1 to 10% by weight.

[Resin (A2)]

As the resin (A2), there is no particular limitation as long as it is a resin which has a structural unit (a') derived from acrylic acid and contains no fluorine atom, and one or more kinds of alkali-soluble resins or resins capable of becoming alkali-soluble, which have conventionally been proposed as a chemically amplified photoresist can be exemplified. When the former is used, the resist composition becomes a negative type, and when the latter is used, the composition becomes a positive type.

As the structural unit (a'), among the structural unit (a) mentioned above in connection with the resin (A1), those which do not contain fluorine atoms can be mentioned.

In the resin (A2), the amount of the structural unit (a') based on the combined total of all structural units constituting the resin (A2) is preferably 50 to 100 mol %, and more preferably 70 to 100 mol %. It is particularly desirable that the resin (A2) consist of the structural unit (a') derived from acrylic acid, as the effects of the present invention becomes excellent.

Here, the expression "consisting of the structural unit (a')" means that the main chain of the resin (A2) is constituted from only the structural unit (a'), and does not contain any other structural units.

Structural Unit (a'1)

When the resist composition for immersion exposure according to the present invention is a positive resist composition, it is preferable that the resin (A2) have a structural unit (a'1) derived from an acrylate ester containing no fluorine atom and having an acid dissociable, dissolution inhibiting group.

As the structural unit (a'1), structural unit (a1) which contain no fluorine atoms can be used.

In the resin (A2), as the structural unit (a'1), one type of structural unit may be used, or two or more types may be used in combination.

In the resin (A2), the amount of the structural unit (a'1) based on the combined total of all structural units constituting the resin (A2) is preferably 10 to 80 mol %, more preferably 20 to 70 mol %, and still more preferably 30 to 60 mol %. By making the amount of the structural unit (a'1) at least as large as the lower limit of the above-mentioned range, a pattern can be easily formed using a resist composition prepared from the resin (A2). On the other hand, by making the amount of the structural unit (a'1) no more than the upper limit of the above-mentioned range, a good balance can be achieved with the other structural units.

Structural Unit (a'2)

The resin (A2) preferably has a structural unit (a'2) derived from an acrylate ester containing no fluorine atoms and having a lactone-containing cyclic group, as well as the structural unit (a'1).

As the structural unit (a'2), structural unit (a2) which contain no fluorine atoms can be used.

In the resin (A2), as the structural unit (a'2), one type of structural unit may be used, or two or more types may be used in combination.

In the resin (A2), the amount of the structural unit (a'2) based on the combined total of all structural units constituting the resin (A2) is preferably 5 to 70 mol %, more preferably 10 to 60 mol %, and still more preferably 20 to 50 mol %. By making the amount of the structural unit (a'2) at least as large as the lower limit of the above-mentioned range, the effect of using the structural unit (a'2) can be satisfactorily achieved. On the other hand, by making the amount of the structural unit (a'2) no more than the upper limit of the above-mentioned range, a good balance can be achieved with the other structural units.

Structural Unit (a'3)

The resin (A2) preferably has a structural unit (a'3) derived from an acrylate ester containing no fluorine atoms and having a polar group-containing aliphatic hydrocarbon group, as well as the structural unit (a'1) and the structural unit (a'2).

As the structural unit (a'3), structural unit (a3) which contain no fluorine atoms can be used.

In the resin (A2), as the structural unit (a'3), one type of structural unit may be used, or two or more types may be used in combination.

In the resin (A2), the amount of structural unit (a'3) based on the combined total of all structural units constituting the resin (A2) is preferably 5 to 50 mol %, more preferably 5 to 40 mol %, and still more preferably 5 to 25 mol %.

Structural Unit (a'4)

The resin (A2) may further contain a structural unit (a'4) which is other than the above-mentioned structural units (a'1) to (a'3), as long as the effects of the present invention are not impaired.

As the structural unit (a'4), any other structural unit which contains no fluorine atoms and cannot be classified as one of the above structural units (a'1) to (a'3) can be used without any particular limitations, and any of the multitude of conventional structural units used within resist resins for ArF excimer lasers or KrF excimer lasers (and particularly for ArF excimer lasers) can be used.

As the structural unit (a'4), structural unit (a4) which contain no fluorine atoms can be used.

In the resin (A2), as the structural unit (a'4), one type of structural unit may be used, or two or more types may be used in combination.

When the structural unit (a'4) is included in the resin (A2), the amount of the structural unit (a'4) based on the combined total of all the structural units that constitute the resin (A2) is typically within a range from 1 to 30 mol %, and preferably from 10 to 20 mol %.

In the present invention, the resin (A2) is preferably a copolymer including at least the structural units (a'1), (a'2) and (a'3). Examples of such a copolymer include a copolymer consisting of the structural units (a'1), (a'2) and (a'3), and a copolymer consisting of the structural units (a'1), (a'2), (a'3) and (a'4).

In the present invention, as the resin (A2), a copolymer including a combination of 3 structural units represented by formula (A2-11) shown below is particularly desirable.

[Chemical Formula 33]

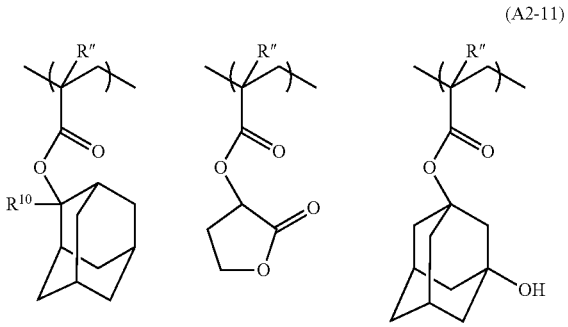

(A2-11)

wherein R" represents a hydrogen atom, a halogen atom other than a fluorine atom, a lower alkyl group or a lower alkyl group in which the hydrogen atoms have been substituted with halogen atoms other than fluorine atoms (halogenated lower alkyl group); and $R^{10}$ represents a lower alkyl group.

In formula (A2-11) above, the lower alkyl group for R" is the same as the lower alkyl group for R. As R", a hydrogen atom or a lower alkyl group is preferable, and a hydrogen atom or a methyl group is more preferable.

The lower alkyl group for $R^{10}$ is the same as the lower alkyl group for R". As $R^{10}$, a methyl group or an ethyl group is preferable, and a methyl group is particularly desirable.

The resin (A2) can be obtained, for example, by a conventional radical polymerization or the like of the monomers corresponding with each of the structural units, using a radical polymerization initiator such as azobisisobutyronitrile (AIBN).

The weight average molecular weight (Mw) (the polystyrene equivalent value determined by gel permeation chromatography) of the resin (A2) is not particularly limited, but is preferably 2,000 to 50,000, more preferably 3,000 to 30,000, and most preferably 5,000 to 20,000. By making the weight average molecular weight no more than the upper limit of the above-mentioned range, the resin (A2) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the component (A), as the resin (A2), one type of resin may be used, or two or more types may be used in combination.

The amount of the resin (A2) within the component (A) is preferably within the range of 50 to 99.9% by weight, more preferably from 80 to 99.9% by weight, and still more preferably 90 to 99.9% by weight. By making the amount of the resin (A2) 50% by weight or more, satisfactory lithography properties can be achieved. On the other hand, by making the amount of the resin (A2) no more than 99.9% by weight, the balance with the resin (A1) becomes satisfactory, and the resistance to an immersion medium becomes satisfactory.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyldiazomethanes; nitrobenzylsulfonate-based acid generators; iminosulfonate-based acid generators; and disulfone-based acid generators.

Examples of onium salt-based acid generators include compounds represented by general formula (b-0) shown below.

[Chemical Formula 34]

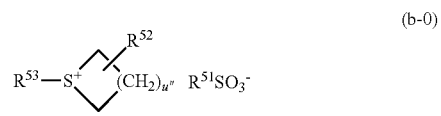

(b-0)

wherein $R^{51}$ represents a linear, branched or cyclic alkyl group, or a linear, branched or cyclic fluorinated alkyl group; $R^{52}$ represents a hydrogen atom, a hydroxyl group, a halogen atom, a linear or branched alkyl group, a linear or branched halogenated alkyl group, or a linear or branched alkoxy group; $R^{53}$ represents an aryl group which may have a substituent; and u" represents an integer of 1 to 3.

In general formula (b-0), $R^{51}$ represents a linear, branched or cyclic alkyl group, or a linear, branched or cyclic fluorinated alkyl group.

The linear or branched alkyl group preferably has 1 to 10 carbon atoms, more preferably 1 to 8 carbon atoms, and most preferably 1 to 4 carbon atoms.

The cyclic alkyl group preferably has 4 to 12 carbon atoms, more preferably 5 to 10 carbon atoms, and most preferably 6 to 10 carbon atoms.

The linear or branched fluorinated alkyl group preferably has 1 to 10 carbon atoms, more preferably 1 to 8 carbon atoms, and most preferably 1 to 4 carbon atoms. The cyclic fluorinated alkyl group preferably has 4 to 12 carbon atoms, more preferably 5 to 10 carbon atoms, and most preferably 6 to 10 carbon atoms. The fluorination ratio of the fluorinated alkyl group (percentage of the number of fluorine atoms substituting the hydrogen atoms within the alkyl group, based on the total number of hydrogen atoms within the alkyl group prior to fluorination) is preferably from 10 to 100%, more preferably from 50 to 100%, and it is particularly desirable that all of the hydrogen atoms are substituted with fluorine atoms, as the acid strength increases.

$R^{51}$ is most preferably a linear alkyl group or fluorinated alkyl group.

$R^{52}$ represents a hydrogen atom, a hydroxyl group, a halogen atom, a linear or branched alkyl group, a linear or branched halogenated alkyl group, or a linear or branched alkoxy group.

Examples of the halogen atom for $R^{52}$ include a fluorine atom, a bromine atom, a chlorine atom and an iodine atom, and a fluorine atom is preferable.

The alkyl group for $R^{52}$ is linear or branched, and preferably has 1 to 5 carbon atoms, more preferably 1 to 4 carbon atoms, and most preferably 1 to 3 carbon atoms.

The halogenated alkyl group for $R^{52}$ is a group in which some or all of the hydrogen atoms of the alkyl group have been substituted with halogen atoms. As the alkyl group of the halogenated alkyl group, the same as the alkyl group for $R^{52}$ may be exemplified. As the halogen atoms for substituting the hydrogen atoms of the alkyl group, the same as the halogen atom for $R^{52}$ may be exemplified. In the halogenated alkyl group, it is preferable that 50 to 100% of the hydrogen atoms of the alkyl group be substituted with halogen atoms, and it is more preferable that all of the hydrogen atoms are substituted with halogen atoms.

The alkoxy group for $R^{52}$ is linear or branched, and preferably has 1 to 5 carbon atoms, more preferably 1 to 4 carbon atoms, and most preferably 1 to 3 carbon atoms.

Among these, as $R^{52}$, a hydrogen atom is particularly desirable.

$R^{53}$ represents an aryl group which may have a substituent, preferably an aryl group of 6 to 20 carbon atoms, and examples of the basic ring excluding the substituent include a naphthyl group, a phenyl group and an anthracenyl group. In terms of the effects of the present invention and absorption of exposure ray such as ArF excimer laser, a phenyl group is preferable.

Examples of the substituent include a hydroxyl group and a lower alkyl group (linear or branched, and preferably has no more than 5 carbon atoms, and a methyl group is particularly desirable).

As the aryl group for $R^{53}$, those which do not have a substituent are preferable.

u" is an integer of 1 to 3, preferably 2 or 3, and it is particularly desirable that u" be 3.

As preferable examples of acid generators represented by general formula (b-0), the following can be exemplified (acid generator group (b-0-1)).

[Chemical Formula 35]

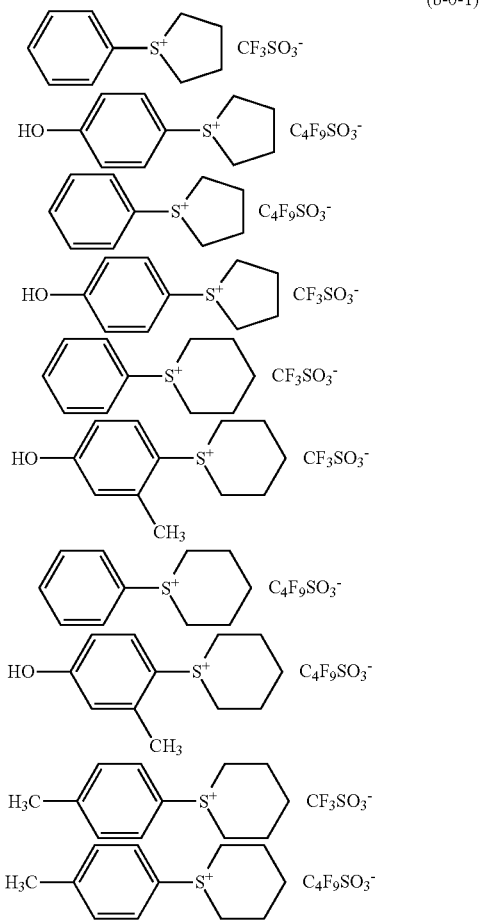

(b-0-1)

Examples of onium salt-based acid generators other than those represented by general formula (b-0) include compounds represented by general formula (b-1) or (b-2) shown below.

[Chemical Formula 36]

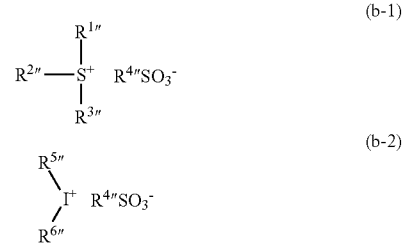

wherein $R^{1\prime\prime}$ to $R^{3\prime\prime}$, $R^{5\prime\prime}$ and $R^{6\prime\prime}$ each independently represents an aryl group or alkyl group; and $R^{4\prime\prime}$ represents a linear, branched or cyclic alkyl group or fluorinated alkyl group, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. Among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ be aryl groups.

The aryl group for $R^{1\prime\prime}$ to $R^{3\prime\prime}$ is not specifically limited. For example, an aryl group having 6 to 20 carbon atoms may be used in which some or all of the hydrogen atoms of the aryl group may or may not be substituted with alkyl groups, alkoxy groups or halogen atoms. The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for $R^{1\prime\prime}$ to $R^{3\prime\prime}$ is not specifically limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that each of $R^{1\prime\prime}$ to $R^{3\prime\prime}$ be a phenyl group or a naphthyl group.

$R^{4\prime\prime}$ represents a linear, branched or cyclic alkyl group or fluorinated alkyl group.

The linear alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1\prime\prime}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group (ratio of fluorine atoms within the alkyl group) is preferably from 10 to 100%, more preferably from 50 to 100%, and it is particularly desirable that all hydrogen atoms are substituted with fluorine atoms because the acid strength increases.

$R^{4\prime\prime}$ is most preferably a linear or cyclic alkyl group or fluorinated alkyl group.

In formula (b-2), $R^{5\prime\prime}$ and $R^{6\prime\prime}$ each independently represents an aryl group or alkyl group. At least one of $R^{5\prime\prime}$ and $R^{6\prime\prime}$ represents an aryl group. It is preferable that both of $R^{5\prime\prime}$ and $R^{6\prime\prime}$ represent an aryl group.

As the aryl group for $R^{5\prime\prime}$ and $R^{6\prime\prime}$, the same as the aryl groups for $R^{1\prime}$ to $R^{3\prime\prime}$ can be exemplified.

As the alkyl group for $R^{5\prime\prime}$ and $R^{6\prime\prime}$, the same as the alkyl groups for $R^{1\prime\prime}$ to $R^{3\prime\prime}$ can be exemplified.

It is particularly desirable that both of $R^{5\prime\prime}$ and $R^{6\prime\prime}$ represent a phenyl group.

As $R^{4\prime\prime}$ in formula (b-2), the same as those mentioned above for $R^{4\prime\prime}$ in formula (b-1) can be exemplified.

Specific examples of suitable onium salt-based acid generators represented by formula (b-1) or (b-2) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-4-methoxy)naphthyl)sulfonium trifluoromethanesulfonate, heptafluoropropanesulfonate or nonafluorobutanesulfonate; and di(1-naphthyl)phenylsulfonium trifluoromethanesulfonate, heptafluoropropanesulfonate or nonafluorobutanesulfonate. It is also possible to use onium salts in which the anion moiety of these onium salts are replaced by methanesulfonate, n-propanesulfonate, n-butanesulfonate, or n-octanesulfonate.

Further, acid generators in which the anion moiety in general formula (b-1) or (b-2) is replaced with an anion moiety represented by general formula (b-3) or (b-4) shown below (the cation moiety is the same as (b-1) or (b-2)) may be used.

[Chemical Formula 37]

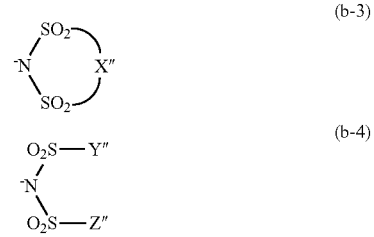

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group of X" or those of the alkyl group of Y" and Z" within the range of the number of carbon atoms, the better the solubility in a resist solvent.

Further, in the alkylene group of X" or the alkyl group of Y" and Z", it is preferable that the number of hydrogen atoms substituted with fluorine atoms is as large as possible, as the acid strength increases, and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 38]

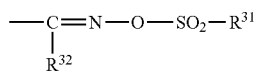

(B-1)

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are replaced with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 39]

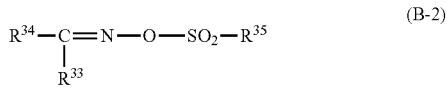

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 40]

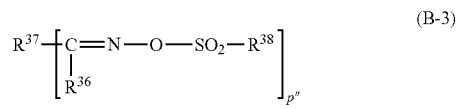

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As for the $R^{33}$, a halogenated alkyl group is preferable, and a fluorinated alkyl group is more preferable.

The fluorinated alkyl group for $R^{33}$ preferably has 50% or more of the hydrogen atoms of the alkyl group fluorinated, more preferably 70% or more, and still more preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthracyl group, and a phenantryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, a fluorinated alkyl group is more preferable, and a partially fluorinated alkyl group is particularly desirable.

In terms of enhancing the strength of the acid generated, the fluorinated alkyl group for $R^{35}$ preferably has 50% or more of the hydrogen atoms of the alkyl group fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following (compounds (B-4)) can be exemplified.

[Chemical Formula 41]

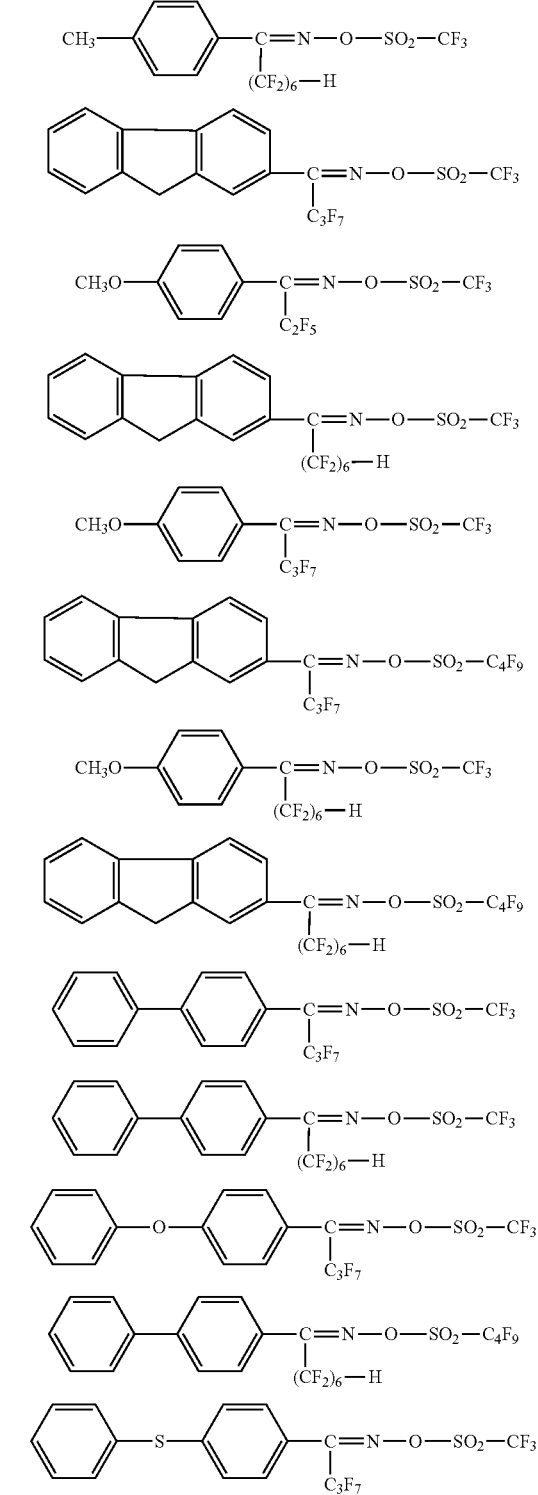

(B-4)

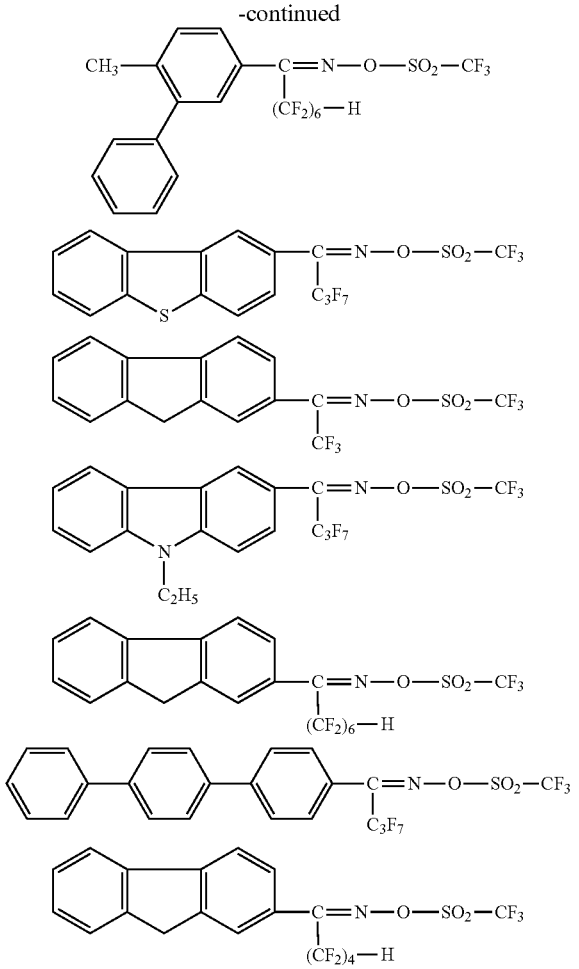

Among the above-exemplified compounds, the following 4 compounds are preferable.

[Chemical Formula 42]

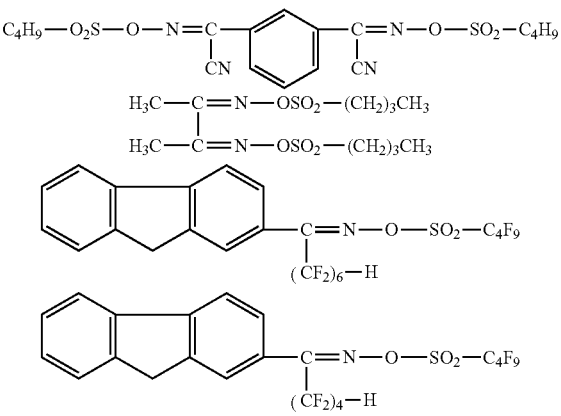

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including
1,3-bis(phenylsulfonyldiazomethylsulfonyl)propane,
1,4-bis(phenylsulfonyldiazomethylsulfonyl)butane,
1,6-bis(phenylsulfonyldiazomethylsulfonyl)hexane,
1,10-bis(phenylsulfonyldiazomethylsulfonyl)decane,
1,2-bis(cyclohexylsulfonyldiazomethylsulfonyl)ethane,
1,3-bis(cyclohexylsulfonyldiazomethylsulfonyl)propane,
1,6-bis(cyclohexylsulfonyldiazomethylsulfonyl)hexane, and
1,10-bis(cyclohexylsulfonyldiazomethylsulfonyl)decane,
may be exemplified.

As the component (B), one type of acid generator may be used, or two or more types may be used in combination.

In the present invention, as the component (B), it is preferable to use an onium salt having a fluorinated alkylsulfonic acid ion as the anion moiety.

The amount of the component (B) within the resist composition for immersion exposure according to the present invention is typically 0.5 to 30 parts by weight, and preferably 1 to 10 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Components>

In the resist composition for immersion exposure according to the present invention, for improving the resist pattern shape and the post exposure stability of the latent image formed by the pattern-wise exposure of the resist layer, it is preferable to add a nitrogen-containing organic compound (D) (hereafter referred to as the component (D)) as an optional component.

A multitude of these components (D) have already been proposed, and any of these known compounds may be used, although a cyclic amine, an aliphatic amine, and particularly a secondary aliphatic amine or tertiary aliphatic amine is preferable.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkylalcoholamines such as diethanolamine, triethanolamine, diisopropanolamine, triisopropanolamine, di-n-octanolamine, and tri-n-octanolamine.

Among these, alkylalcoholamines and trialkylamines are preferable, and alkylalcoholamines are particularly desirable. Among alkylalcoholamines, triethanolamine and triisopropanolamine are preferable.

Examples of the cyclic amine include a heterocyclic compound containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2] octane.

These compounds can be used either alone, or in combinations of two or more different compounds.

The component (D) is typically used in an amount within a range from 0.01 to 5.0 parts by weight, relative to 100 parts by weight of the component (A).

Furthermore, in the resist composition for immersion exposure according to the present invention, for preventing any deterioration in sensitivity, and improving the resist pattern shape and the post exposure stability of the latent image formed by the pattern-wise exposure of the resist layer, an organic carboxylic acid, or a phosphorus oxo acid or derivative thereof (E) (hereafter referred to as the component (E)) can also be added as another optional component.

Examples of suitable organic carboxylic acids include acetic acid, malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid.

The component (E) is typically used in an amount within a range from 0.01 to 5.0 parts by weight, relative to 100 parts by weight of the component (A).

If desired, other miscible additives can also be added to the resist composition for immersion exposure according to the present invention. Examples of such miscible additives include additive resins for improving the performance of the resist film, surfactants for improving the applicability, dissolution inhibitors, plasticizers, stabilizers, colorants, halation prevention agents, and dyes.

The resist composition for immersion exposure according to the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-amyl ketone methyl isoamyl ketone, and 2-heptanone; polyhydric alcohols and derivatives thereof, such as ethylene glycol, diethylene glycol, propylene glycol and dipropylene glycol; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, amylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably from 1:9 to 9:1, more preferably from 2:8 to 8:2.

More specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate, depending on the thickness of the coating film. In general, the component (S) is used in an amount such that the solid content of the resist composition becomes within the range from 2 to 20% by weight, and preferably from 5 to 15% by weight.

Dissolving of the materials for a resist composition in the component (S) can be conducted by simply mixing and stirring each of the above components together using conventional methods, and where required, the composition may also be mixed and dispersed using a dispersion device such as a dissolver, a homogenizer, or a triple roll mill. Furthermore, following mixing, the composition may also be filtered using a mesh or a membrane filter or the like.

By the resist composition for immersion exposure according to the present invention, both of excellent resistance to an immersion medium and excellent lithography properties can be achieved. The reason for this has not been elucidated yet, but is presumed that the properties of the resist film surface is changed by using a combination of the resin (A1) and resin (A2) as the component (A), and including the resin (A1) in an specific amount.

More specifically, the reason is presumed as follows. With respect to a resist film formed by using the resist composition for immersion exposure according to the present invention, the balance between the contact angles to water such as the static contact angle (the contact angle as measured with respect to the resist film in a horizontal state), the dynamic contact angle (the contact angle at which a water droplet starts to slide when the resist film is inclined, including the contact angle at the front-end point of the water droplet in the sliding direction (advancing angle) and the contact angle at the rear-end point of the water droplet in the sliding direction (receding angle)) and sliding angle (the inclination angle of the resin film at which a water droplet starts to slide when the resist film is inclined) is different from a resist composition in which only the resin (A2) is used as the component (A). For example, the static contact angle (hereafter, in the present description, the static contact angle is simply referred to as the contact angle) and the receding angle become large. On the other hand, the sliding angle is not always affected by the addition of the resin (A1), and the sliding angle may become larger or smaller, or may not change.

As described above, in an immersion exposure, the resist film comes into contact with an immersion medium such as water. Therefore, it is presumed that the elution of a substance from the resist is affected by the properties of the resist film surface (e.g., hydrophilicity and hydrophobicity). In the present invention, it is presumed that the properties of the resist film surface are changed by the use of the specific component (A), and as a result, a resist film in which the elution of a substance is suppressed and which exhibits excellent lithography properties can be obtained.

As shown in FIG. 1, when a droplet 1 is placed on a plane 2 and the plane 2 is gradually inclined, the receding angle is the angle $\theta_1$ formed between the upper end 1a of the droplet 1 and the plane 2 as the droplet 1 starts to move (slide) on the plane 2. The sliding angle is the inclination angle $\theta_2$ of the plane 2 as measured when the droplet 1 starts to move (slide) on the plane 2.

In the present description, the contact angle is measured in the following manner.

First, a resist composition solution is spin-coated onto a silicone substrate having a diameter of 6 inches, and then heated at a temperature of 90° C. for 90 seconds to form a resist film.

Thereafter, using FACE contact angle meter, model CA-X150 (product name; manufactured by Kyowa Interface Science Co., Ltd.), the resin film is contacted with a microsyringe equipped on the contact angle meter (whereby 2 µL of pure water is dropped from the microsyringe), and the contact angle is measured with respect to a formed droplet.

In the present description, the receding angle and the sliding angle can be measured by forming a resist film in the same manner as described above, followed by measuring the angles using commercially available measurement apparatuses such as AUTO SLIDING ANGLE: SA-30 DM (manufactured by Kyowa Interface Science Co. Ltd.), and AUTO DISPENSER: AD-31 (manufactured by Kyowa Interface Science Co. Ltd.).

With respect to the resist composition for immersion exposure according to the present invention, it is preferable that a resist film formed by using the resist composition have a contact angle of 60 degrees or more, more preferably 65 degrees or more, and most preferably 60 to 90 degrees. When the contact angle is 60 degrees or more, the effect of suppressing the elution of a substance during the immersion exposure is enhanced. The reason for this has not been elucidated yet, but it is presumed that one of the main reasons is related to the hydrophobicity of the resist film. More specifically, it is presumed that since an aqueous substance such as water is used as the immersion medium, higher hydrophobicity has an influence on the swift removal of the immersion medium from the surface of the resist film after the immersion exposure. On the other hand, when the contact angle is 90 degrees or less, the effects of the invention can be satisfactorily achieved.

For the same reasons as described above, with respect to the resist composition for immersion exposure according to the present invention, it is preferable that a resist film formed by using the resist composition have a receding angle of 45 degrees or more, more preferably 50 to 150 degrees, still more preferably 55 to 130 degrees, and most preferably 60 to 100 degrees.

The level of the contact angle and the receding angle can be adjusted by changing the mixing ratio of the resin (A1) and the resin (A2) within the component (A), and the amount of the structural unit (a'3). For example, by making the amount of the resin (A1) within the component (A) 1% by weight or more, the receding angle becomes significantly large as compared to the case where the resin (A2) is used alone.

As described above, in the present invention, elution of a substance into the immersion medium can be suppressed. As a result, degeneration of the resist film and change in refractive index of the immersion medium can also be suppressed. Further, as a result of suppression of change in refractive index of the immersion medium and the like, various lithography properties such as undulation and LER of the pattern and shape of the resist pattern becomes satisfactory, and the level of contamination of the lens within the exposure apparatus can be lowered. Therefore, there is no need for protection against these disadvantages, and hence, the present invention can contribute to simplifying the process and the exposure apparatus.

Next, the method of forming a resist pattern according to the present invention will be described.

The method of forming a resist pattern according to the present invention includes applying a resist composition for immersion exposure according to the present invention to a substrate to form a resist film on the substrate; subjecting the resist film to immersion exposure; and developing the resist film to form a resist pattern.

A preferable example of the method of forming a resist pattern according to the present invention will be described.

First, a resist composition for immersion exposure according to the present invention is applied to the surface of a substrate such as a silicon wafer using a spinner or the like, and a prebake (PAB treatment) is performed, to thereby form a resist film.

An organic or inorganic anti-reflection film may be optionally provided between the substrate and the applied layer of the resist composition to form a double-layer laminate.

Alternatively, a double-layer laminate in which an organic anti-reflective film is provided on top of the resist film can be formed, or a triple-layer laminate further including an additional bottom layer anti-reflection film can be formed.

The anti-reflection film provided on top of the resist film is preferably soluble in an alkali developing solution.

The steps up until this point can be conducted by using conventional techniques. The operating conditions and the like are appropriately selected depending on the formulation and the characteristics of the resist composition for immersion exposure being used.

Subsequently, the obtained resist film is subjected to selective immersion exposure (liquid immersion lithography) through a desired mask pattern. At this time, the region between the resist film and the lens at the lowermost point of the exposure apparatus is pre-filled with a solvent (immersion medium) that has a larger refractive index than the refractive index of air, and the exposure (immersion exposure) is conducted in this state.

There are no particular limitations on the wavelength used for the exposure, and an ArF excimer laser, KrF excimer laser or $F_2$ laser or the like can be used. The resist composition according to the present invention is effective for KrF or ArF excimer lasers, and is particularly effective for ArF excimer lasers.

As described above, in a formation method of the present invention, during exposure, the region between the resist film and the lens at the lowermost point of the exposure apparatus is filled with an immersion medium, and exposure (immersion exposure) is conducted in this state.

The immersion medium preferably exhibits a refractive index larger than the refractive index of air but smaller than the refractive index of the resist composition being used. The refractive index of the immersion medium is not particularly limited as long at it satisfies the above-mentioned requirements.

Examples of this immersion medium which exhibits a refractive index that is larger than the refractive index of air but smaller than the refractive index of the resist composition being used include water, fluorine-based inert liquids, and silicon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

A resist composition for immersion exposure according to the present invention is particularly resistant to any adverse effects caused by water, and because the resulting sensitivity and shape of the resist pattern profile are excellent, water is preferably used as the immersion medium which exhibits a refractive index that is larger than the refractive index of air. Furthermore, water is also preferred in terms of cost, safety, environmental friendliness, and versatility.

Subsequently, following completion of the immersion exposure step, post exposure baking (PEB) is conducted, and then a developing treatment is performed using an alkali developing liquid formed from an aqueous alkali solution. Thereafter, water rinse is preferably conducted with pure water. This water rinse is conducted by dripping or spraying water onto the surface of the substrate while rotating the substrate, and washes away the developing solution and those portions of the resist composition for immersion exposure that have been dissolved by the developing solution. By conducting a subsequent drying treatment, a resist pattern is obtained in which the resist film (coating of the resist composition for immersion exposure) has been patterned into a shape corresponding to the mask pattern.

EXAMPLES

As follows is a description of examples of the present invention, although the scope of the present invention is by no way limited by these examples.

In the following examples and comparative examples, the resins used were synthesized from monomers (1) to (7) described below. Specifically, a monomer having the composition shown in Table 1 was dissolved in tetrahydrofuran (THF), and a radical polymerization initiator V-601 (Wako Pure Chemical Industries, Ltd.) was added thereto, to thereby obtain a mixed solution. The obtained mixed solution was dropwise added to THF in a separate container over 6 hours to effect a polymerization reaction, thereby obtaining a resin.

With respect to the obtained resin, GPC measurement was conducted, and the weight average molecular weight (Mw) and dispersity thereof were determined. The results are shown in Table 1.

[Chemical Formula 43]

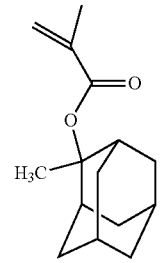

(1)

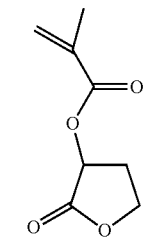

(2)

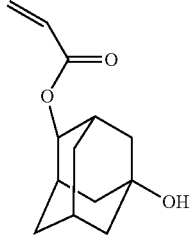

(3)

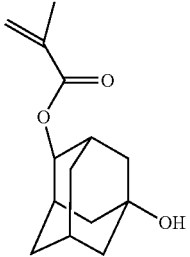

(4)

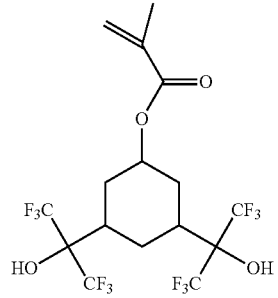

(5)

-continued (6)
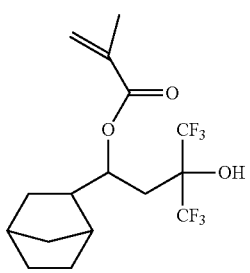

(7)
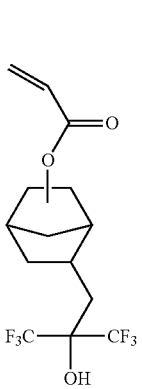

TABLE 1

|       | (1) | (2) | (3) | (4) | 5) | (6) | (7) | Mw    | Mw/Mn |
|-------|-----|-----|-----|-----|----|-----|-----|-------|-------|
| (A)-1 | 30  | 50  | 20  |     |    |     |     | 10000 | 1.7   |
| (A)-2'|     |     |     |     | 100|     |     | 12000 | 1.3   |
| (A)-3 | 50  |     |     |     |    | 50  |     | 13600 | 1.9   |
| (A)-4 | 40  |     |     |     |    | 60  |     | 9300  | 1.5   |
| (A)-5 | 40  | 40  | 20  |     |    |     |     | 7000  | 1.6   |
| (A)-6 | 40  | 20  | 20  | 20  |    |     |     | 15000 | 2.0   |
| (A)-7 | 35  | 20  | 20  | 25  |    |     |     | 9600  | 1.6   |
| (A)-8 | 40  | 20  | 20  |     |    | 20  |     | 9000  | 1.8   |
| (A)-9 | 40  | 50  |     |     |    |     | 10  | 10000 | 2.0   |
| (A)-10| 30  | 50  |     |     |    |     | 20  | 12000 | 2.0   |
| (A)-11| 30  | 30  |     |     |    |     | 40  | 12000 | 2.0   |

The resin (A)-2' was further reacted with chloromethoxymethane to substitute some of the hydrogen atoms of the hydroxyl groups within the resin (A)-2' with methoxymethyl groups, thereby obtaining a resin (A)-2. As a result of measuring the resin (A)-2 by proton NMR, it was found that 40 mol % of the hydroxyl groups of the resin (A)-2' have been substituted with methoxymethyl groups.

The structures of resins (A)-1 to (A)-11 are shown below.

In the formulas, the subscript numerals at the lower right of the parentheses indicate the ratio (mol %) of the structural units.

Further, in formula (A)-2, each R represents a hydrogen atom or a methoxymethyl group, wherein 40% of R within the resin (A)-2 are methoxymethyl groups.

[Chemical Formula 44]

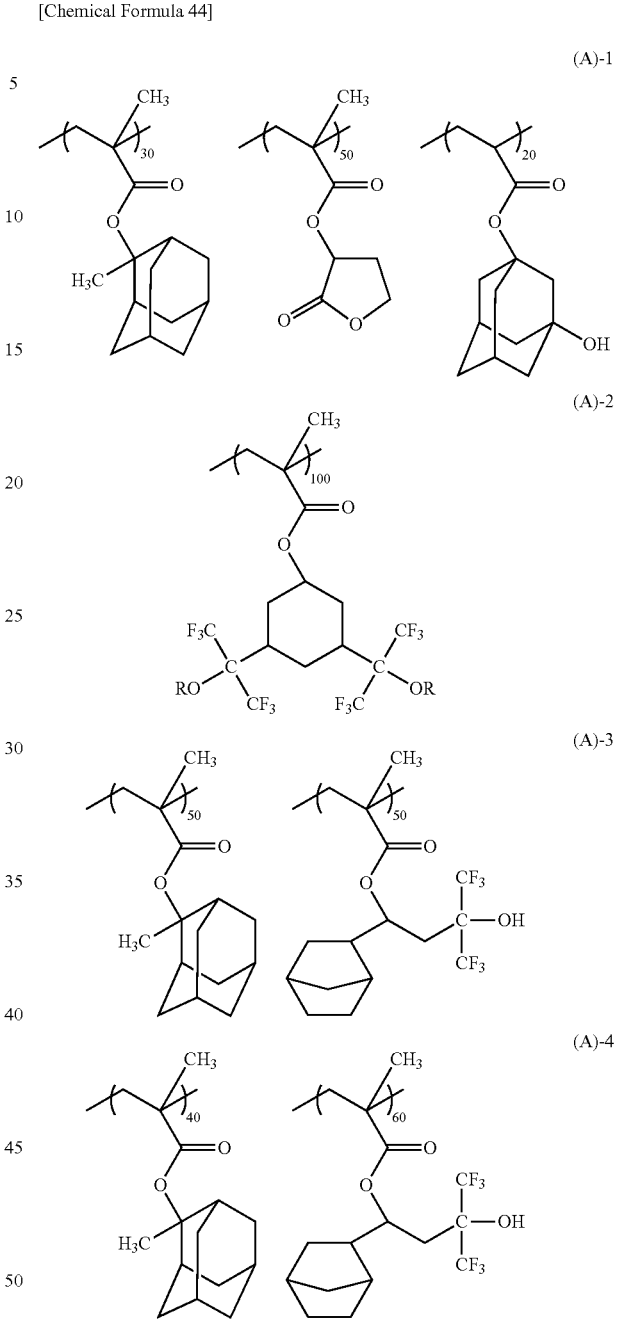

[Chemical Formula 45]

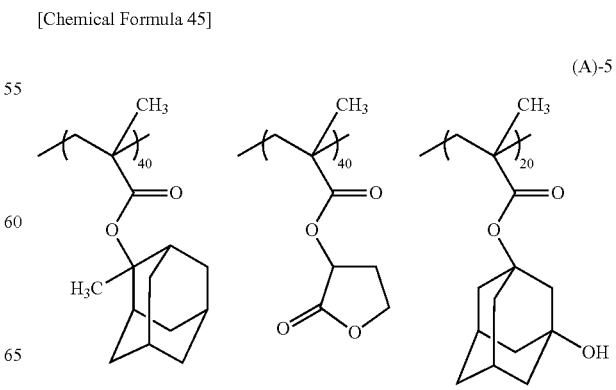

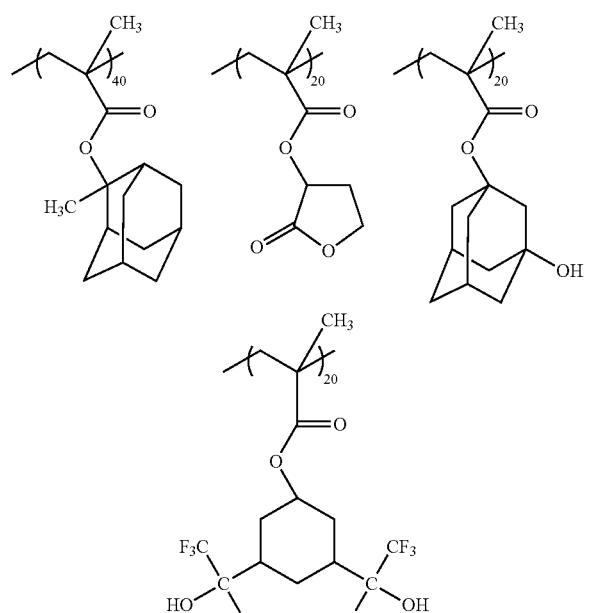

(A)-6

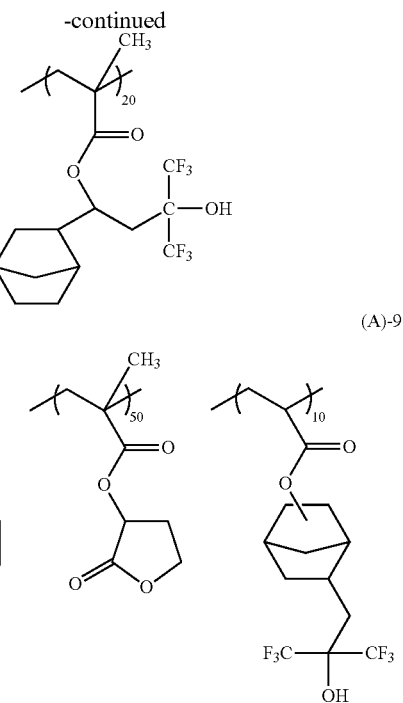

(A)-9

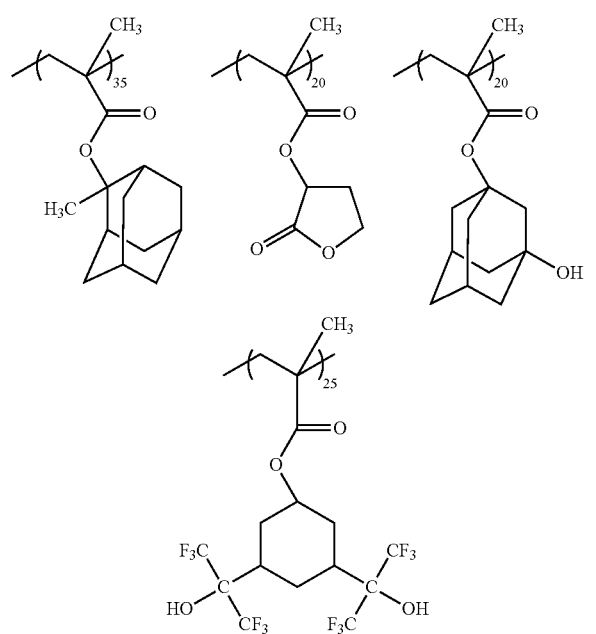

(A)-7

(A)-10

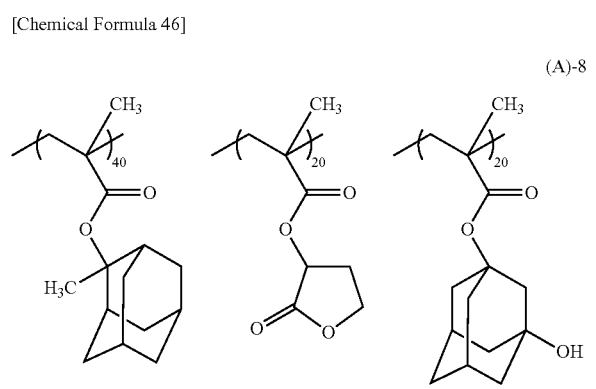

[Chemical Formula 46]

(A)-8

(A)-11

Examples 1 to 40 and Comparative Examples 1 to 5

The components shown in Tables 2 to 4 were mixed and dissolved to obtain positive resist composition solutions.

In Tables 2 to 4, the reference characters indicate the following. Further, the values in brackets [ ] indicate the amount (in terms of parts by weight) of the component added.

(B)-1: (4-methylphenyl)diphenylsulfonium nonafluorobutanesulfonate (D)-1: tripentylamine (S)-1: a mixed solvent of PGMEA/PGME=6/4 (weight ratio)

Using the obtained positive resist composition solutions, the following evaluations were performed.

<Measurement of Contact Angle>

Using FACE contact angle meter, model CA-X150 (product name; manufactured by Kyowa Interface Science Co., Ltd.), the contact angle, the sliding angle and the receding angle were measured in the following manner.

Firstly, a positive resist composition solution was applied onto an 8-inch silicon wafer using a spinner, and was heated at 95° C. for 90 seconds to thereby form a resist film having a thickness of 175 nm. Then, the resist film in a horizontal state was contacted with the a microsyringe equipped on the contact angle meter (whereby 2 μL of pure water was dropped from the microsyringe), and the contact angle (contact angle to water) was measured with respect to a droplet on the resist film (measurement of contact angle prior to exposure).

Further, a resist film was formed in the same manner as described above, and the contact angle (contact angle to water) was measured in substantially the same manner as described above, except that an open frame exposure (exposure without a mask) was performed using a simple exposure apparatus VUVES4500 (manufactured by Lintec Japan Corporation) with an ArF excimer laser (193 nm) (measurement of contact angle after exposure).

The results are shown in Tables 2 to 4.

<Measurement of Receding Angle and Sliding Angle>

The obtained positive resist composition solution was applied onto an 8-inch silicon wafer using a spinner, and was prebaked on a hot plate at 110° C. for 90 seconds to thereby form a resist film having a thickness of 175 nm. Then, one droplet (50 μl) of pure water was dropped onto the resist film, and the receding angle and the sliding angle were measured using the apparatus under conditions as described below (measurement of receding angle and sliding angle prior to exposure).

Further, a resist film was formed in the same manner as described above, and the receding angle and the sliding angle were measured in substantially the same manner as described above, except that an open frame exposure (exposure without a mask) was performed using a simple exposure apparatus VUVES4500 (manufactured by Lintec Japan Corporation) with an ArF excimer laser (193 nm) (measurement of receding angle and sliding angle after exposure).

The results are shown in Tables 2 to 4.

<Name of Apparatus>

AUTO SLIDING ANGLE: SA-30 DM (manufactured by Kyowa Interface Science Co. Ltd.)

AUTO DISPENSER: AD-31 (manufactured by Kyowa Interface Science Co. Ltd.)

<Analysis Software>

FAMAS

As shown in the results below, in Examples 1 to 10 in which the resin (A)-1 classified as the resin (A2) was used in combination with the resins (A)-2 to (A)-4 classified as the resin (A1), the contact angle and receding angle prior to exposure were large as compared to those in Comparative Example 1 in which only resin (A)-1 was used, and the sliding angle was the same or smaller than that in Comparative Example 1. Further, in Examples 1 to 10, the contact angle and receding angle after exposure were also large as compared to those in Comparative Example 1.

Furthermore, in Examples 11 to 40 in which the resin (A)-5 classified as the resin (A2) was used in combination with the resins (A)-6 to (A)-11 classified as the resin (A1), the contact angle and receding angle prior to and after exposure were large as compared to that in Comparative Example 5 in which only the resin (A)-5 was used. Further, in Examples 11 to 40, the sliding angle after exposure was the same or smaller than that in Comparative Example 5.

TABLE 2

|  | Component (A) |  | Component (B) | Component (D) | Component (S) | Contact angle (°) | | Sliding angle (°) | | Receding angle (°) | |
|---|---|---|---|---|---|---|---|---|---|---|---|
|  |  |  |  |  |  | Prior to exposure | After exposure | Prior to exposure | After exposure | Prior to exposure | After exposure |
| Comp. Ex. 1 | (A)-1 [100] | — | (B)-1 [4.0] | (D)-1 [0.4] | (S)-1 [1350] | 64.5 | 64.5 | 25.5 | 29.0 | 50.7 | 47.6 |
| Comp. Ex. 2 | — | (A)-2 [100] | (B)-1 [4.0] | (D)-1 [0.4] | (S)-1 [1350] | 86.1 | 79.5 | 17.0 | 21.0 | 76.8 | 70.8 |
| Example 1 | (A)-1 [75] | (A)-2 [25] | (B)-1 [4.0] | (D)-1 [0.4] | (S)-1 [1350] | 85.1 | 81.8 | 17.5 | 21.0 | 75.2 | 71.9 |
| Example 2 | (A)-1 [90] | (A)-2 [10] | (B)-1 [4.0] | (D)-1 [0.4] | (S)-1 [1350] | 84.7 | 85.8 | 17.5 | 16.0 | 75.9 | 76.7 |
| Example 3 | (A)-1 [99] | (A)-2 [1] | (B)-1 [4.0] | (D)-1 [0.4] | (S)-1 [1350] | 76.2 | 77.3 | 23.5 | 24.0 | 63.3 | 63.2 |
| Example 4 | (A)-1 [99.9] | (A)-2 [0.1] | (B)-1 [4.0] | (D)-1 [0.4] | (S)-1 [1350] | 67.2 | 66.8 | 24.5 | 28.0 | 53.3 | 50.3 |
| Comp. Ex. 3 | — | (A)-3 [100] | (B)-1 [4.0] | (D)-1 [0.4] | (S)-1 [1350] | 88.1 | 95.2 | 13.0 | 13.0 | 88.1 | 87.9 |
| Example 5 | (A)-1 [95] | (A)-3 [5] | (B)-1 [4.0] | (D)-1 [0.4] | (S)-1 [1350] | 81.9 | 81.5 | 21.0 | 23.0 | 68.1 | 65.7 |
| Example 6 | (A)-1 [99] | (A)-3 [1] | (B)-1 [4.0] | (D)-1 [0.4] | (S)-1 [1350] | 72.8 | 73.4 | 23.0 | 26.5 | 59.6 | 56.8 |
| Example 7 | (A)-1 [99.9] | (A)-3 [0.1] | (B)-1 [4.0] | (D)-1 [0.4] | (S)-1 [1350] | 66.6 | 66.5 | 25.0 | 22.5 | 52.3 | 54.5 |
| Comp. Ex. 4 | — | (A)-4 [100] | (B)-1 [4.0] | (D)-1 [0.4] | (S)-1 [1350] | 88.8 | 89.3 | 11.0 | 11.0 | 83.5 | 82.7 |
| Example 8 | (A)-1 [95] | (A)-4 [5] | (B)-1 [4.0] | (D)-1 [0.4] | (S)-1 [1350] | 85.2 | 85.8 | 15.0 | 17.0 | 74.7 | 73.2 |
| Example 9 | (A)-1 [99] | (A)-4 [1] | (B)-1 [4.0] | (D)-1 [0.4] | (S)-1 [1350] | 70.8 | 70.4 | 23.5 | 27.0 | 56.5 | 54.4 |
| Example 10 | (A)-1 [99.9] | (A)-4 [0.1] | (B)-1 [4.0] | (D)-1 [0.4] | (S)-1 [1350] | 66.4 | 66.8 | 26.0 | 29.0 | 51.9 | 48.5 |

TABLE 3

|  | Component (A) | | Component (B) | Component (D) | Component (S) | Contact angle (°) | | Sliding angle (°) | | Receding angle (°) | |
|---|---|---|---|---|---|---|---|---|---|---|---|
|  |  |  |  |  |  | Prior to exposure | After exposure | Prior to exposure | After exposure | Prior to exposure | After exposure |
| Comp. Ex. 5 | (A)-5 [100] | — | (B)-1 [4.0] | (D)-1 [0.4] | (S)-1 [1350] | 66.6 | 68.7 | 23.5 | 32.0 | 53.2 | 50.0 |
| Example 11 | (A)-5 [50] | (A)-6 [50] | (B)-1 [4.0] | (D)-1 [0.4] | (S)-1 [1350] | 83.3 | 81.7 | 19.0 | 23.5 | 70.4 | 65.5 |
| Example 12 | (A)-5 [80] | (A)-6 [20] | (B)-1 [4.0] | (D)-1 [0.4] | (S)-1 [1350] | 79.3 | 78.6 | 21.0 | 24.5 | 66.1 | 62.4 |
| Example 13 | (A)-5 [90] | (A)-6 [10] | (B)-1 [4.0] | (D)-1 [0.4] | (S)-1 [1350] | 74.8 | 74.8 | 21.5 | 26.0 | 63.4 | 57.6 |
| Example 14 | (A)-5 [95] | (A)-6 [5] | (B)-1 [4.0] | (D)-1 [0.4] | (S)-1 [1350] | 71.5 | 71.3 | 23.0 | 28.0 | 58.2 | 53.4 |
| Example 15 | (A)-5 [99] | (A)-6 [1] | (B)-1 [4.0] | (D)-1 [0.4] | (S)-1 [1350] | 67.7 | 68.9 | 23.5 | 30.0 | 54.2 | 50.5 |
| Example 16 | (A)-5 [50] | (A)-7 [50] | (B)-1 [4.0] | (D)-1 [0.4] | (S)-1 [1350] | 83.4 | 84.5 | 21.0 | 23.0 | 72.5 | 68.5 |
| Example 17 | (A)-5 [80] | (A)-7 [20] | (B)-1 [4.0] | (D)-1 [0.4] | (S)-1 [1350] | 82.5 | 82.9 | 20.0 | 24.0 | 70.3 | 65.9 |
| Example 18 | (A)-5 [90] | (A)-7 [10] | (B)-1 [4.0] | (D)-1 [0.4] | (S)-1 [1350] | 78.9 | 78.5 | 22.0 | 25.5 | 64.7 | 61.6 |
| Example 19 | (A)-5 [95] | (A)-7 [5] | (B)-1 [4.0] | (D)-1 [0.4] | (S)-1 [1350] | 75.0 | 74.5 | 23.0 | 28.5 | 61.2 | 56.9 |
| Example 20 | (A)-5 [99] | (A)-7 [1] | (B)-1 [4.0] | (D)-1 [0.4] | (S)-1 [1350] | 69.5 | 70.2 | 23.5 | 29.5 | 56.4 | 51.2 |
| Example 21 | (A)-5 [50] | (A)-8 [50] | (B)-1 [4.0] | (D)-1 [0.4] | (S)-1 [1350] | 73.5 | 73.5 | 25.0 | 27.0 | 60.7 | 59.0 |
| Example 22 | (A)-5 [80] | (A)-8 [20] | (B)-1 [4.0] | (D)-1 [0.4] | (S)-1 [1350] | 71.7 | 72.4 | 25.0 | 30.0 | 59.4 | 55.7 |
| Example 23 | (A)-5 [90] | (A)-8 [10] | (B)-1 [4.0] | (D)-1 [0.4] | (S)-1 [1350] | 70.6 | 70.7 | 25.0 | 30.0 | 57.9 | 53.3 |
| Example 24 | (A)-5 [95] | (A)-8 [5] | (B)-1 [4.0] | (D)-1 [0.4] | (S)-1 [1350] | 68.9 | 69.1 | 25.0 | 31.0 | 55.8 | 51.1 |
| Example 25 | (A)-5 [99] | (A)-8 [1] | (B)-1 [4.0] | (D)-1 [0.4] | (S)-1 [1350] | 68.3 | 82.3 | 27.0 | 32.5 | 53.6 | 50.3 |

TABLE 4

|  | Component (A) | | Component (B) | Component (D) | Component (S) | Contact angle (°) | | Sliding angle (°) | | Receding angle (°) | |
|---|---|---|---|---|---|---|---|---|---|---|---|
|  |  |  |  |  |  | Prior to exposure | After exposure | Prior to exposure | After exposure | Prior to exposure | After exposure |
| Example 26 | (A)-5 [50] | (A)-9 [50] | (B)-1 [4.0] | (D)-1 [0.4] | (S)-1 [1350] | 75.0 | 74.5 | 23.0 | 29.5 | 60.8 | 54.9 |
| Example 27 | (A)-5 [80] | (A)-9 [20] | (B)-1 [4.0] | (D)-1 [0.4] | (S)-1 [1350] | 71.3 | 70.9 | 24.0 | 29.5 | 57.1 | 52.7 |
| Example 28 | (A)-5 [90] | (A)-9 [10] | (B)-1 [4.0] | (D)-1 [0.4] | (S)-1 [1350] | 70.0 | 68.8 | 24.0 | 30.5 | 55.8 | 51.0 |
| Example 29 | (A)-5 [95] | (A)-9 [5] | (B)-1 [4.0] | (D)-1 [0.4] | (S)-1 [1350] | 68.5 | 69.0 | 25.0 | 32.0 | 54.4 | 50.5 |
| Example 30 | (A)-5 [99] | (A)-9 [1] | (B)-1 [4.0] | (D)-1 [0.4] | (S)-1 [1350] | 67.9 | 68.7 | 25.5 | 32.0 | 53.5 | 50.1 |
| Example 31 | (A)-5 [50] | (A)-10 [50] | (B)-1 [4.0] | (D)-1 [0.4] | (S)-1 [1350] | 76.5 | 75.4 | 25.0 | 27.5 | 60.4 | 58.4 |
| Example 32 | (A)-5 [80] | (A)-10 [20] | (B)-1 [4.0] | (D)-1 [0.4] | (S)-1 [1350] | 72.7 | 73.8 | 26.0 | 29.5 | 58.1 | 54.6 |
| Example 33 | (A)-5 [90] | (A)-10 [10] | (B)-1 [4.0] | (D)-1 [0.4] | (S)-1 [1350] | 71.9 | 71.6 | 26.0 | 31.0 | 57.4 | 52.4 |
| Example 34 | (A)-5 [95] | (A)-10 [5] | (B)-1 [4.0] | (D)-1 [0.4] | (S)-1 [1350] | 70.1 | 69.3 | 25.0 | 31.0 | 55.5 | 52.5 |
| Example 35 | (A)-5 [99] | (A)-10 [1] | (B)-1 [4.0] | (D)-1 [0.4] | (S)-1 [1350] | 68.5 | 68.9 | 25.0 | 32.0 | 53.5 | 50.3 |
| Example 36 | (A)-5 [50] | (A)-11 [50] | (B)-1 [4.0] | (D)-1 [0.4] | (S)-1 [1350] | 78.3 | 78.1 | 23.0 | 26.5 | 65.0 | 61.7 |
| Example 37 | (A)-5 [80] | (A)-11 [20] | (B)-1 [4.0] | (D)-1 [0.4] | (S)-1 [1350] | 76.7 | 77.4 | 23.5 | 28.0 | 64.6 | 60.0 |
| Example 38 | (A)-5 [90] | (A)-11 [10] | (B)-1 [4.0] | (D)-1 [0.4] | (S)-1 [1350] | 75.7 | 75.6 | 23.5 | 28.5 | 63.4 | 59.5 |
| Example 39 | (A)-5 [95] | (A)-11 [5] | (B)-1 [4.0] | (D)-1 [0.4] | (S)-1 [1350] | 73.4 | 75.0 | 23.5 | 29.0 | 61.1 | 57.0 |
| Example 40 | (A)-5 [99] | (A)-11 [1] | (B)-1 [4.0] | (D)-1 [0.4] | (S)-1 [1350] | 73.0 | 74.4 | 23.5 | 31.0 | 59.3 | 54.6 |

89

<Lithography Properties>

An organic anti-reflection film composition (product name: ARC-29, manufactured by Brewer Science Ltd.) was applied onto the surface of an 8-inch silicon wafer using a spinner, and the composition was then baked at 205° C. for 60 seconds, thereby forming an organic anti-reflection film having a thickness of 77 nm.

The positive resist composition solution obtained above was applied onto the surface of the anti-reflection film using a spinner, and was then prebaked (PAB) on a hotplate at 120° C. for 90 seconds and dried, thereby forming a resist film having a film thickness of 175 nm.

Subsequently, the resist film was selectively irradiated with an ArF excimer laser (193 nm) through a mask pattern, using an ArF exposure apparatus NSR-S302 (manufactured by Nikon Corporation, NA (numerical aperture)=0.60, ⅔ annular illumination).

Thereafter, a PEB treatment was conducted at 120° C. for 90 seconds, followed by development for 30 seconds at 23° C. in a 2.38% by weight aqueous solution of tetramethylammonium hydroxide. Then, the resist was washed for 30 seconds with pure water, followed by drying by shaking, thereby forming a 120 nm line and space (1:1) resist pattern (hereafter referred to as a L/S pattern).

The thus formed L/S patterns were observed by SEM. As a result, it was found that the L/S patterns formed by using the positive resist compositions of Examples 1 to 40 and Comparative Example 1 exhibited substantially the same lithography properties.

On the other hand, with respect to the positive resist compositions of Comparative Example 2 in which only the resin (A)-2 was used and Comparative Example 3 in which only the resin (A)-3 was used, it was found that, although resist patterns were resolved, the thickness loss of the patterns was extremely poor. With respect to the positive resist composition of Comparative Example 4 in which only the resin (A)-4 was used, a resist pattern could not be resolved.

<Evaluation of Eluted Substance>

Using the positive resist composition solutions of Example 8 and Comparative Example 1, resist films were formed in the same manner as described above. Then, using VRC310S (manufactured by S.E.S CO., LTD.), one droplet of pure water (150 μl) was moved from the center of the wafer in a circular manner at room temperature at a constant linear velocity (area: 221.56 cm$^2$). Thereafter, the droplet was collected, and analyzed by an analyzing apparatus Agilent-HP1100 LC-MSD (manufactured by Agilent Technologies), and the amounts of elution (mol/cm$^2$) of the cation moiety (PAG+) and anion moiety (PAG−) of the component (B) were determined.

Further, resist films were formed in the same manner as described above. Then, an open frame exposure (exposure without a mask) was performed using a simple exposure apparatus VUVES4500 (manufactured by Lintec Japan Corporation) with an ArF excimer laser (193 nm).

Subsequently, the exposed resist film was analyzed in the same manner as described above, and the amounts of elution (mol/cm$^2$) of the cation moiety (PAG+) and anion moiety (PAG−) of the component (B) were determined.

90

The results are shown in Table 5.

TABLE 5

| | Amount of elution (×10$^{-12}$ mol/cm$^2$) | | | |
|---|---|---|---|---|
| | Prior to exposure | | After exposure | |
| | PAG+ | PAG− | PAG+ | PAG− |
| Comp. Ex. 1 | 13.26 | 23.6 | 0.94 | 45.6 |
| Example 8 | 3.91 | 12.1 | 0.15 | 28.7 |

As seen from the results shown above, when the positive resist composition of Example 8 using a combination of the resin (A)-1 and the resin (A)-4 was used, elution of the component (B) into the immersion medium (water) was suppressed prior to and after exposure, and hence, the effect of suppressing elution was confirmed. On the other hand, when the positive resist composition of Comparative 1 using the resin (A)-1 alone was used, elution of the component (B) into the immersion medium (water) was conspicuously observed prior to and after exposure.

In the above-described evaluations, the "amount of elution prior to exposure" is for evaluating the amount of elution at unexposed portions of the resist film during the formation of a resist pattern by selective exposure. Further, the "amount of elution after exposure" is for evaluating the amount of elution at the exposed portions. Therefore, since the amount of a substance eluted into the immersion medium (water) was small both prior to and after exposure, it was confirmed that the positive resist composition of Example 8 exhibited an excellent resistance to an immersion medium, and hence, the positive resist composition can be preferably used in a method of forming a resist pattern including an immersion exposure step.

Further, as seen from the results shown above, the contact angle and the receding angle increase by using the resin (A1) in combination with the resin (A2), and the levels of the contact angle and the receding angle correlate with the effect of suppressing the elution of a substance.

Therefore, it is evident that the resist composition of the present invention in which the resin (A1) is used in combination with the resin (A2) and the content of the resin (A1) within the component (A) is from 0.1 to 50% by weight can achieve both of excellent resistance to an immersion medium and excellent lithography properties, and hence, the resist composition can be preferably used for immersion exposure.

Industrial Applicability

The resist composition of the present invention can achieve both of excellent resistance to an immersion medium and excellent lithography properties, and hence, the resist composition can be preferably used for immersion exposure and a method of forming a resist pattern.

The invention claimed is:

1. A resist composition for immersion exposure comprising a resin component (A) which exhibits changed alkali solubility under action of acid and an acid-generator component (B) which generates acid upon irradiation,
    said resin component (A) comprising a resin (A1) which contains a structural unit (a0) selected from the group consisting of structural units represented by general formulas (a0-1) to (a0-3) shown below, a structural unit (a1) selected from the group consisting of structural units represented by general formulas (a1-0-1) and (a1-0-2) shown below, a structural unit (a2) derived from an acrylate ester having a lactone-containing cyclic group and a structural unit (a3) derived from an acrylate ester having a polar group-containing aliphatic hydrocarbon group,

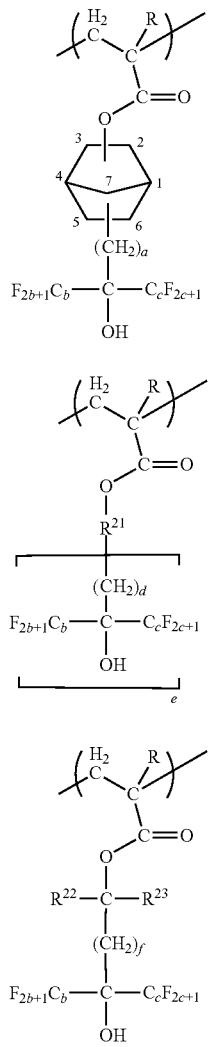

(a0-1)

(a0-2)

(a0-3)

wherein R represents a hydrogen atom, an alkyl group, a halogen atom or a halogenated alkyl group; $R^{21}$ represents an aliphatic cyclic group having a valency of (e+1); $R^{22}$ and $R^{23}$ each independently represents a hydrogen atom or a monovalent aliphatic cyclic group, with the proviso that at least one of $R^{22}$ and $R^{23}$ represents an aliphatic cyclic group; a, d and f each independently represents an integer of 0 to 5; b and c each independently represents an integer of 1 to 5; and e represents 2 or 3,

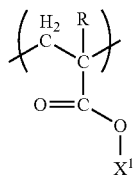

(a1-0-1)

wherein, R represents a hydrogen atom, halogen atom, lower alkyl group, or halogenated lower alkyl group; and $X^1$ represents an acid dissociable, dissolution inhibiting group,

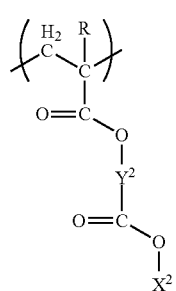

(a1-0-2)

wherein, R represents a hydrogen atom, halogen atom, lower alkyl group, or halogenated lower alkyl group; $X^2$ represents an acid dissociable, dissolution inhibiting group; and $Y^2$ represents an alkylene group or an aliphatic cyclic group, and a resin (A2) which has a structural unit (a'1) derived from an acrylate ester containing no fluorine atom and having an acid dissociable, dissolution inhibiting group, a structural unit (a'2) derived from an acrylate ester containing no fluorine atom and having a lactone-containing cyclic group and a structural unit (a'3) derived from an acrylate ester containing no fluorine atom and having a polar group-containing aliphatic hydrocarbon group, wherein the amount of said resin (A1) contained in said resin component (A) is within the range from 0.1 to 20% by weight.

2. The resist composition for immersion exposure according to claim 1, which further comprises a nitrogen-containing organic compound (D).

3. A method of forming a resist pattern, comprising:
applying a resist composition for immersion exposure of claim 1 to a substrate to form a resist film on the substrate; subjecting said resist film to immersion exposure; and developing said resist film to form a resist pattern.

4. The resist composition for immersion exposure according to claim 1, wherein said structural unit (a0) comprises at least one member selected from the group consisting of structural units represented by general formulas (a0-2) and (a0-3).

* * * * *

UNITED STATES PATENT AND TRADEMARK OFFICE
CERTIFICATE OF CORRECTION

PATENT NO.       : 8,192,914 B2
APPLICATION NO.  : 12/094399
DATED            : June 5, 2012
INVENTOR(S)      : Makiko Irie It is certified that error appears in the above-identified patent and that said Letters Patent is hereby corrected as shown below:

At (Item 56), Page 2, Column 2, Line 13, Under Other Publications, change "Synethsis" to --Synthesis--.

At Column 2, Line 41, After "161313" insert --.--.

At Column 2, Line 58, Change "tens." to --lens.--.

At Column 9, Line 2, Change "hereafter," to --(hereafter,--.

At Column 13, Line 17, After "ring" insert --.--.

At Column 14, Line 66, Change "1 to" to --1 to 5--.

At Column 64, Line 43, Change "(bis-sulfonyldiazomethanes;" to --(bis-sulfonyl)diazomethanes;--.

At Column 66, Line 59, Change "$R^{6"}$" to --$R^{5"}$--.

At Column 67, Line 2, Change "$R^{3"}$" to --$R^{1"}$--.

At Column 67, Line 59, Change "$R^{1'}$ to" to --$R^{1"}$ to--.

At Column 68, Line 20, Change "diphenyl(1-4-methoxy)" to --diphenyl(1-(4-methoxy)--.

At Column 68, Line 63, Change "of Y' and" to --of Y" and--.

At Column 73, Lines 33-37 (Approx), Change

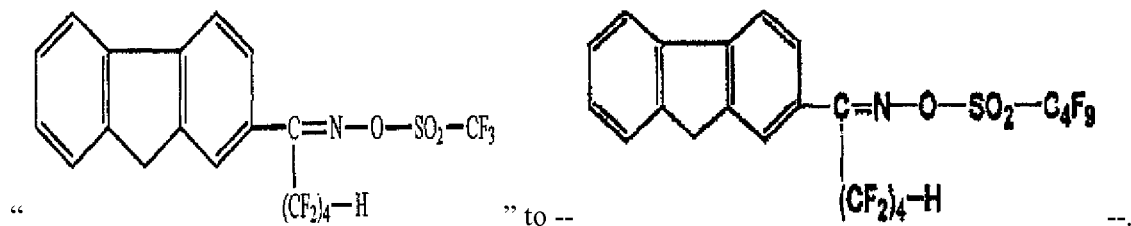

At column 79, Line 10, Change "as long at" to --as long as--.

At Column 85, Line 12 (Approx), Change "the a" to --the--.

Signed and Sealed this
Twenty-fifth Day of December, 2012

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 8,192,914 B2 |
| APPLICATION NO. | : 12/094399 |
| DATED | : June 5, 2012 |
| INVENTOR(S) | : Makiko Irie |

It is certified that error appears in the above-identified patent and that said Letters Patent is hereby corrected as shown below:

At (Item 56), Page 2, Column 2, Line 13, Under Other Publications, change "Synethsis" to --Synthesis--.

At Column 2, Line 41, After "161313" insert --.--.

At Column 2, Line 58, Change "tens." to --lens.--.

At Column 9, Line 2, Change "hereafter," to --(hereafter,--.

At Column 13, Line 17, After "ring" insert --.--.

At Column 14, Line 66, Change "1 to" to --1 to 5--.

At Column 64, Line 43, Change "(bis-sulfonyldiazomethanes;" to --(bis-sulfonyl)diazomethanes;--.

At Column 66, Line 59, Change "$R^{6''}$" to --$R^{5''}$--.

At Column 67, Line 2, Change "$R^{3''}$" to --$R^{1''}$--.

At Column 67, Line 59, Change "$R^{1'}$ to" to --$R^{1''}$ to--.

At Column 68, Line 20, Change "diphenyl(1-4-methoxy)" to --diphenyl(1-(4-methoxy)--.

At Column 68, Line 63, Change "of Y' and" to --of Y'' and--.

This certificate supersedes the Certificate of Correction issued December 25, 2012.

Signed and Sealed this
Nineteenth Day of February, 2013

Teresa Stanek Rea
*Acting Director of the United States Patent and Trademark Office*

At Column 73, Lines 24-28 (Approx.),
Change " 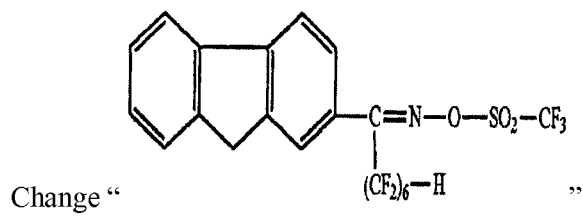 "
to -- 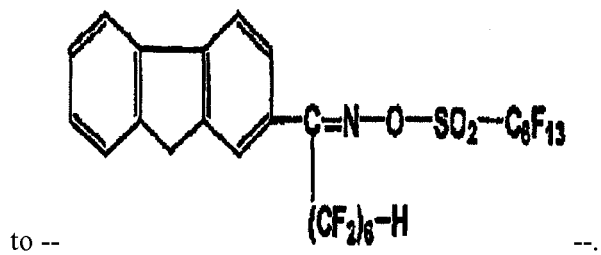 --.
At Column 73, Lines 33-37 (Approx.),
Change " 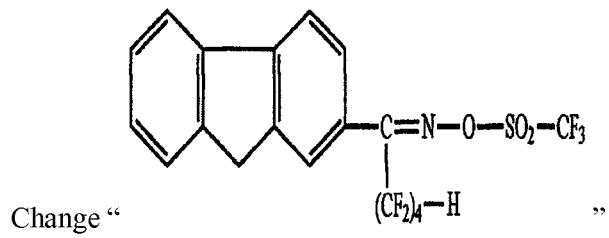 "
to -- 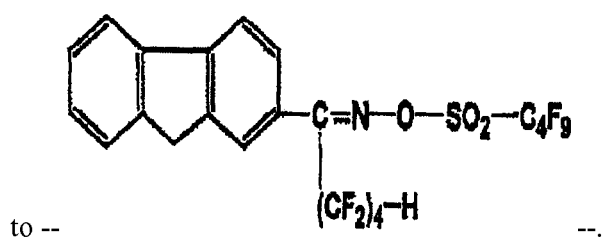 --.
At column 79, Line 10, Change "as long at" to --as long as--.
At Column 85, Line 12 (Approx.), Change "the a" to --the--.